United States Patent [19]

Funakoshi

[11] Patent Number: 5,612,554
[45] Date of Patent: Mar. 18, 1997

[54] CHARGE DETECTION DEVICE AND DRIVER THEREOF

[75] Inventor: Hiromasa Funakoshi, Hirakata, Japan

[73] Assignee: Matsushita Electric Industrial Co., Ltd., Osaka, Japan

[21] Appl. No.: 263,892

[22] Filed: Jun. 22, 1994

[30] Foreign Application Priority Data

Jun. 23, 1993 [JP] Japan .................................. 5-152056
Dec. 10, 1993 [JP] Japan .................................. 5-310439

[51] Int. Cl.$^6$ .................................................. H01L 27/148
[52] U.S. Cl. ........................ 257/215; 257/216; 257/219; 257/250
[58] Field of Search ........................ 257/239, 249, 257/250, 216, 235, 215, 219

[56] References Cited

U.S. PATENT DOCUMENTS

| | | | |
|---|---|---|---|
| 4,993,053 | 2/1991 | Itoh et al. | 257/239 |
| 5,286,989 | 2/1994 | Yonemoto | 257/239 |
| 5,294,817 | 3/1994 | Yamamoto | 257/239 |

FOREIGN PATENT DOCUMENTS 2-9139  1/1990  Japan.

OTHER PUBLICATIONS

IEEE International Solid–State Circuits Conference, Feb. 15, 1973, Digest of Technical Papers pp. 154–155, D.D. Wen et al., "Session XII: Amplifier Techniques—Analysis and Design of a Single–Stage Floating Gate Amplifier".

IEEE Journal of Solid–State Circuits, vol. SC–9, No. 6, Dec. 1994, pp. 410–414, D.D. Wen, "Design and Operation of a Floating Gate Amplifier".

*Primary Examiner*—Wael Fahmy
*Assistant Examiner*—Fetsum Abraham
*Attorney, Agent, or Firm*—Wenderoth, Lind & Ponack

[57] ABSTRACT

In a charge detection device of a charge coupled device, an unnecessary overlap between a floating gate and other gates are reduced. A gate of a source follower amplifier is also formed in an active region. Further, the floating gate is connected to a gate of the source follower amplifier, and a bias gate and the floating gate overlap above a field oxide film. A bias gate voltage is controlled according to fluctuations of floating gate voltage. Thus, floating gate potential is kept constant.

21 Claims, 20 Drawing Sheets

CHARGE DETECTION DEVICE AND DRIVER THEREOF

BACKGROUND OF THE INVENTION

1. Field of the Invention

The present invention relates to a charge coupled device (CCD) or in particular to a charge detection device therein and a driver thereof.

2. Description of the Prior Art

An floating diffusion amplifier (FDA) and a floating gate amplifier (FGA) are known as representatives of charge detection devices of a charge coupled device (CCD). Especially a floating gate amplifier can realize an amplifier without reset noises and without destruction. Details of a floating gate amplifier is described in following papers: Wen and Salsbury, "Analysis and Design of a Single Stage floating Gate Amplifier", ISSCC Dig. Tech. Papers, February 1973 pp. 154–155; and Wen, "Design and Operation of a floating Gate Amplifier", IEEE Journal of Solid-State Circuits, Vol. SC-9, No.6, December 1974, pp. 410–414.

However, a prior art charge detection device with a floating gate amplifier has a problem that the sensitivity of charge detection is low. This is ascribed to a parasitic capacitance. Because a floating gate has to be extended to a first stage transistor of a source follower, a parasitic capacitance cannot be reduced to a large extent. The above papers state that it is important to increase capacitance C1 and decrease capacitances C2, C3, C4 and Cin.

FIG. 1A shows a plan view of a charge detection device of a charge coupled device around a floating gate amplifier thereof and FIG. 1B shows a section along a line A—A' in FIG. 1A. This charge coupled device corresponds to prior art Wen's device. A P well 97 and an n layer 98 and a gate oxide film 96 are layered successively, and a floating gate 95 is arranged on the gate oxide film 96 similarly to gates ø1–ø3. Further, a bias gate 94 is formed above the floating gate 95. The floating gate 95 overlaps with gates ø1 and ø3. In an actual floating gate amplifier, parasitic capacitances other than the above-mentioned ones also exist. A parasitic capacitance C6 exists between the floating gate 95 and the gate ø1, while another parasitic capacitance C7 exists between the floating gate 95 and the gate ø3. Then, the sensitivity of the floating gate amplifier is as low as 0.4–0.5 times that of a floating diffusion amplifier.

Further, because the floating gate 95 is floating electrically, when a leakage current exists, a potential of the floating gate fluctuates, and this affects an output signal. At present, any insulating film cannot reduce the leakage current to zero. There is a tendency that the leakage current increases with increasing potential of the floating gate 95. Further, in FIG. 1B, an etching boundary of the bias gate 94 of aluminum is formed above the n layer 98 (a channel of signal charge Q). Then, it is observed that a leakage current increased between the floating gate 95 and the bias gate 94 and between the floating gate 95 and the n layer 98 because a stress is applied to around the etching boundary in a heating process.

SUMMARY OF THE INVENTION

An object of the present invention is to provide a charge detection device having a high sensitivity of charge detection.

Another object of the present invention is to provide a charge detection device and its driver wherein there are little fluctuations of floating gate potential due to leakage current.

In one aspect of the present invention, parasitic capacitances of a charge detection device of charge coupled device are reduced in various ways. Signal charge is transferred through a buried region by a charge transfer section for driving the signal charge and an output gate formed at an end of the charge transfer section. A floating gate is formed adjacent to said output gate and detects signal charges transferred through the buried region and it is connected to an amplifier. A bias means controls an electric potential of the floating gate. The floating gate has a gap with respect to the output gate and the reset means.

Preferably, a charge accumulation area of the charge transfer means is larger than that of the floating gate means. Preferably, the device further comprises a first P well formed below the embedding region and a second P well separated from the first P well, wherein the bias means is formed above the second P well through an insulating film. Preferably, a gate width of the floating gate means is larger at a central portion thereof. Preferably, an N type impurity injection layer is formed below a central portion of the floating gate means. Preferably, the device further comprises: a first P well formed below the embedding region; and a second P well separated from the first P well. The second P well having a concentration, smaller than the first P well contacts with the embedding region below the floating gate means. Preferably, the device further comprises a first insulating film formed on the semiconductor substrate, which first insulating film comprising a nitride film, and a second insulating film having a thickness smaller than the first insulating film. The charge transfer means is formed on the first insulating film, and the floating gate means, the reset means and the amplifier means are formed on the second insulating film. Preferably, the device further comprises a reset drain for discharging signal charges, and signals having same phase as those applied to the output gate means are applied to the reset drain. Preferably, the device further comprises a field oxide film for separating the amplifier means and the charge transfer means. The bias means and the floating gate means overlaps via an insulating film above the field oxide film. Preferably, a gate of the amplifier means is formed only in an active region of a transistor. Preferably, the floating gate means is made from a metal or a polysilicon with a metal formed at the back side thereof. Preferably, the device further comprises a gate means connected electrically to the bias means, wherein the floating gate means is arranged between the bias means and the gate means. Preferably, a signal amplitude of driving signals applied to a last gate of the charge transfer means is larger than those applied to the other gates of the charge transfer means.

In another aspect of the invention, a driver is provided to drive a charge detection device stably. It comprises a floating gate amplifier comprising a bias means, a charge coupled device which uses the floating gate amplifier for charge detection, a sample and hold means for sampling a part of an output signal or the charge coupled device, and a controller for controlling a signal applied to the bias means according to an output of the sample and hold means. Preferably, the sample and hold circuit samples an output signal of the charge coupled device when signal charges are discharged from an optical black section or from the floating gate amplifier as a charge detection device.

In a different aspect of the invention, a driver of charge detection device comprises a floating gate amplifier comprising a bias means, a charge coupled device which uses the floating gate amplifier for charge detection, a pulse generator for generating blanking signals and driving signals for the charge coupled device, and a bias gate voltage controller for controlling signals applied to the bias means according to signals from the pulse generator. Preferably, a voltage applied to the bias means is set as V1 in horizontal and vertical blanking periods and as V2 in operating periods and V1>V2. Preferably, the charge coupled device comprises a reset means and the bias means and the reset means are driven with phases reverse to each other.

An advantage of the present invention is that the sensitivity of charge detection of a charge detection device is improved by reducing stray capacitances in a floating gate amplifier.

Another advantage of the present invention is that a charge detection device provides stable output signals because the floating gate potential does not vary with leakage current.

A third advantage of the present invention is that a charge detection device having high sensitivity and providing stable output signals can be provided with a simple structure.

A fourth advantage of the present invention is that a charge detection device is driven to supply stable output signals.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1A:
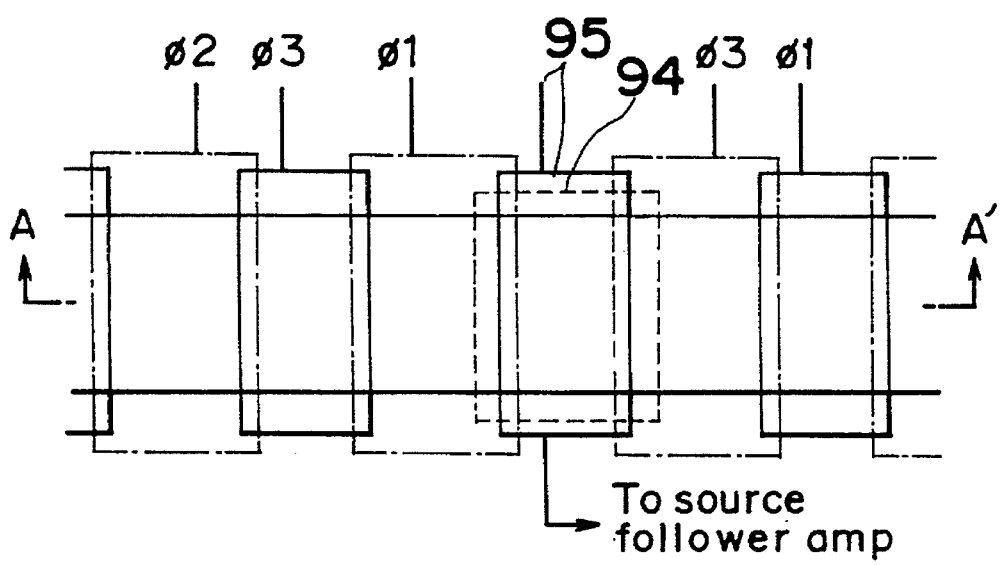
FIG. 1A is a schematic plan view of a prior art charge detection device around a floating gate amplifier and FIG. 1B is a sectional view along A—A' line in FIG. 1A.
Figure 1B:
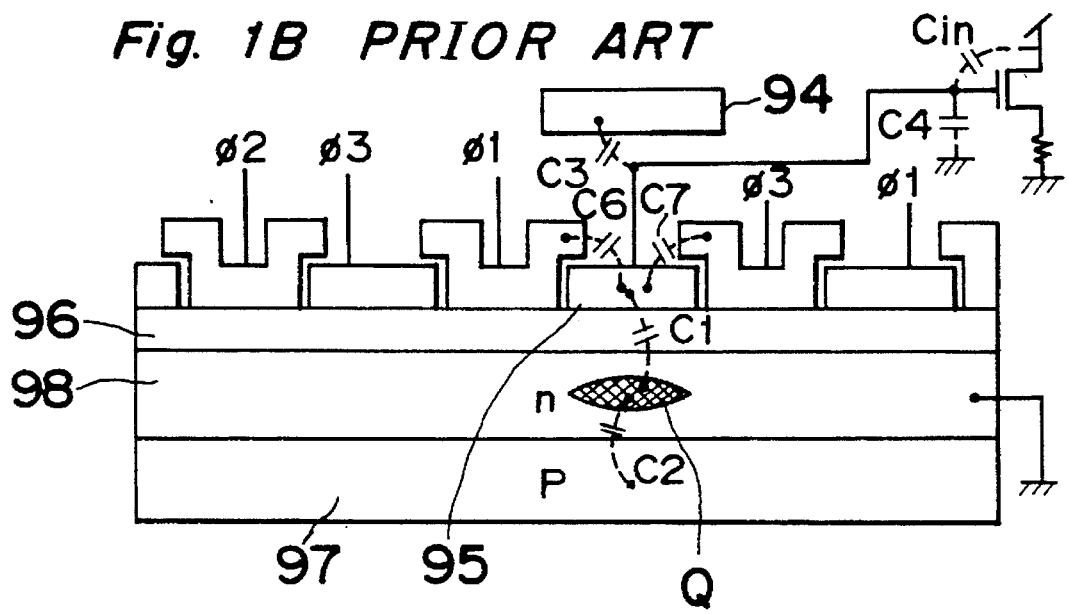

Referring now to the drawings, wherein like reference characters designate like or corresponding parts throughout the views, FIGS. 1A and 1B show an entire charge coupled device with a floating gate amplifier. Photons entering a photodiode 90 are converted to signal charge Q to be stored in the photodiode 90. After a prescribed time passes, the signal charge Q is read by a vertical charge coupled device (VCCD) 91 and sent via a horizontal charge coupled device (HCCD) 92 to a floating gate amplifier 94. Thus, the signal charge is read as a voltage. In the present invention, a structure of the floating gate amplifier 93 is changed to reduce parasitic capacitance and leakage current.

EMBODIMENT 1

Figure 3A:
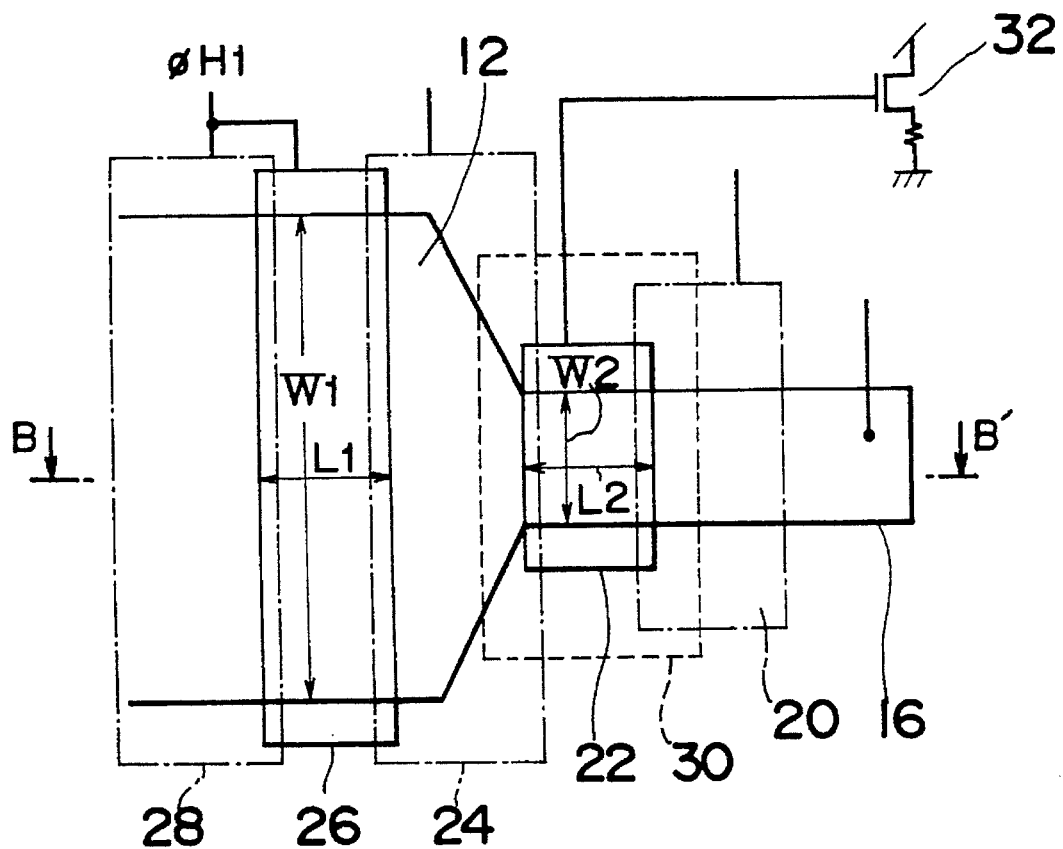
FIG. 3A is a schematic plan view of a charge detection device around a floating gate amplifier of a first embodiment and FIG. 3B is a sectional view along B—B' line in FIG. 3A.
Figure 3B:
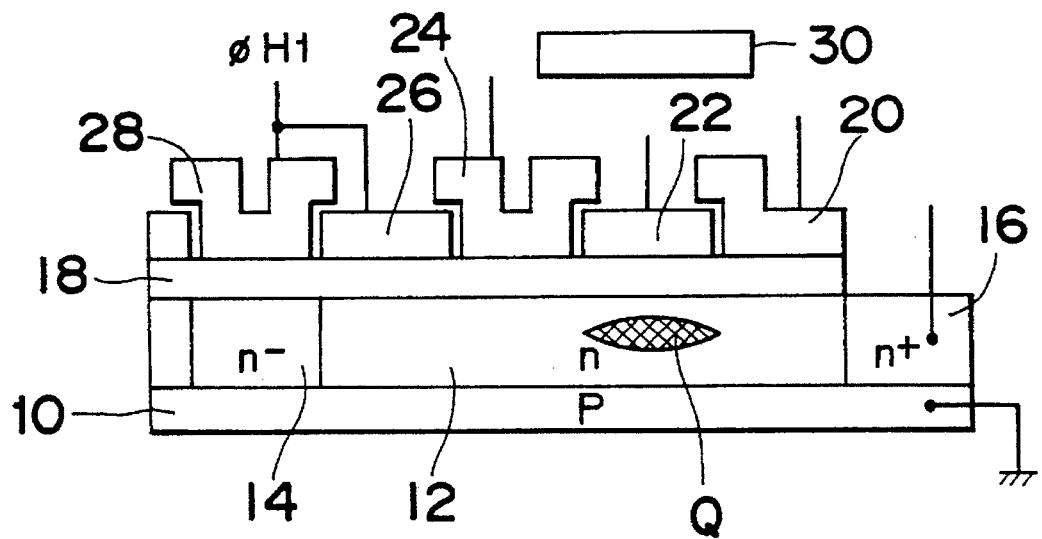

FIG. 3A is a schematic plan view of a charge detection device around a floating gate amplifier of a first embodiment, and FIG. 3B is a sectional view along B—B' line in FIG. 3A. A P well 10 is formed in a semiconductor substrate, and an n layer 12 is formed on the P well 10. An n$^-$ region 14 is formed in the n layer 12 while a reset drain 16 of an n$^+$ region are formed at an end of the n layer 12. The n$^-$ region 14 is formed at a position below a gate 28 to be formed later. The n layer 12 and n$^-$ region 14 are all buried regions, and signal charge is transferred through them. Next, a gate oxide layer 18 is formed on the n layer 12 and n$^-$ region 14. Further, a reset gate 20, a floating gate 22 for charge detection, an output gate 24 and gates 26, 28 for applying signal øH1 for charge transfer are formed on the gate oxide film 18. In a case shown in FIG. 3A, same signals is applied to the gates 26 and 28. Further, a bias gate 30 is formed via an insulating film (not shown) above the floating gate 22. A source follower amplifier 32 of a transistor is connected to the floating gate 22.

Signal charge Q is transferred through the n layer, by applying signals øH1 to the gates 26, 28, from below the output gate 24 to below the floating gate 22. Then, a presence of the signal charge Q below the floating gate 22 causes potential of the floating gate 22 to change by $\Delta V$ as compared to the potential of the floating gate 22 in the absence of the signal charge Q, in other words the floating gate 22 performs charge-to-voltage conversion. The signal charge detected by the floating gate 22 is discharged to the reset drain 16 by using the reset gate 20. Because the floating gate 22 is connected to a source follower amplifier 32, signal voltage $\Delta V$ is converted to an output value of a low impedance. This mechanism of charge detection is also similar in other embodiments explained layer, and it is not repeated any more.

A feature of the first embodiment is that an area for charge storage of a charge detection section, i.e., the area of floating gate 22 is smaller than that of a charge transfer section. The charge transfer section comprises an HCCD 92 (FIG. 1) which indicates a one end thereof gates 28 and 26, and the output gate 24, the gate 26 having a length L1 and a width W1 as shown in FIG. 3A. On the other hand, the charge detection section comprises a floating gate 22 and it has a length L2 and a width W2. As shown in FIG. 3A, a width of the n layer 12 is reduced from a position below the gate 28 to another position below the floating gate 22. In the present embodiment, L1*W1>L2*W2. An amount of charges stored below the floating gate 22 is determined with reference to off potentials of the output gate 24, the floating gate 22 and the reset gate 20. In the present embodiment, the area of the charge transfer section or the floating gate 22 is reduced, so that the parasitic capacitance C1 between the signal charge Q and the floating gate 22, C2 between the signal charge Q and the P well 10 and C3 between the floating gate 22 and the bias gate 30 are smaller than the counterparts in the prior art shown in FIGS. 1A and 1B. Further, overlaps between the floating gate 22 with the output gate 24 and between the floating gate 22 and the reset gate 20 are reduced than the counterparts in the prior art shown in FIGS. 1A and 1B, so that a parasitic capacitance C6 between the floating gate 22 with the output gate 24 and a parasitic capacitance C7 between the floating gate 22 and the reset gate 20 become small. As explained above, parasitic capacitances around the charge detection section are reduced to a large extent, a sensitivity of charge detection can be improved.

EMBODIMENT 2

Figure 4A:
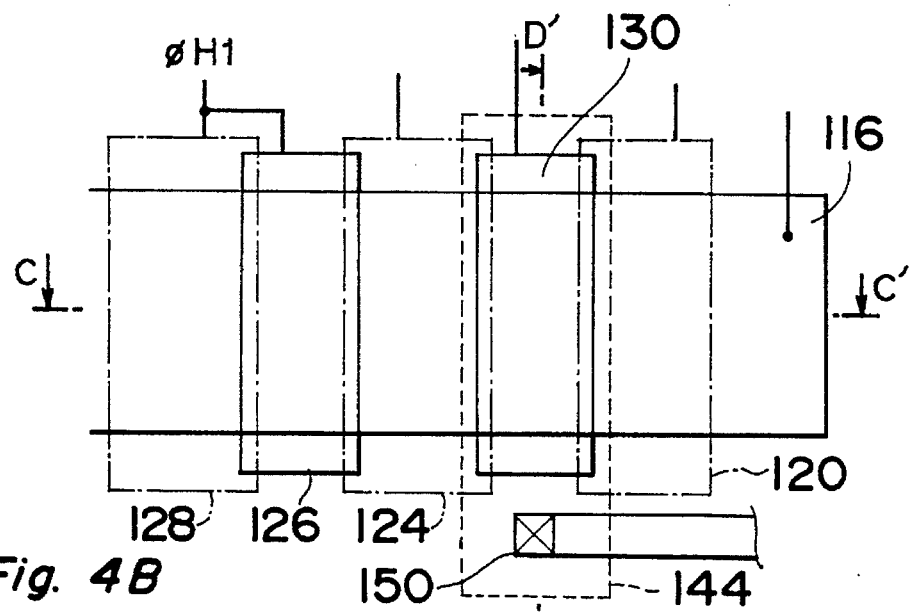
FIG. 4A is a schematic plan view of a charge detection device around a floating gate amplifier of a second embodiment.
Figure 4B:
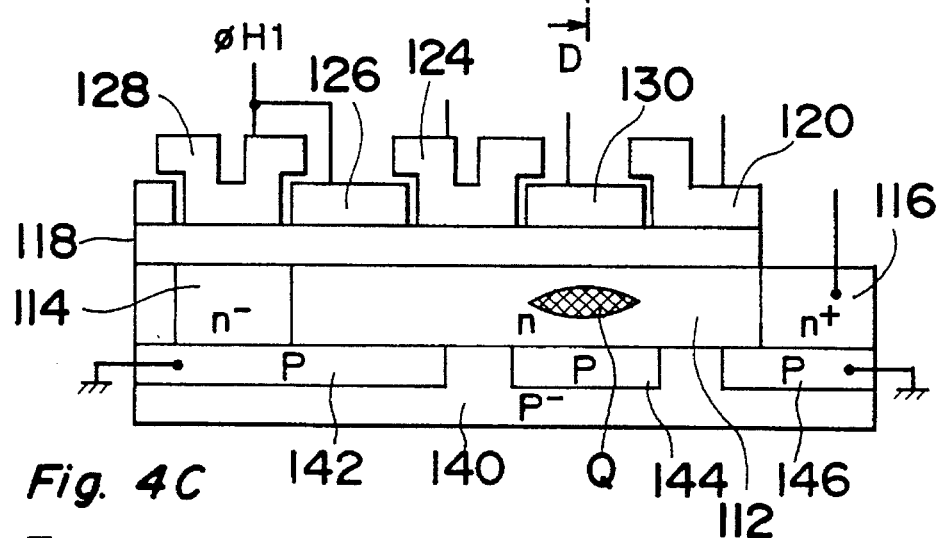
FIGS. 4B and 4C are sectional views along C—C' line and along D—D' line in FIG. 4A.
Figure 4C:
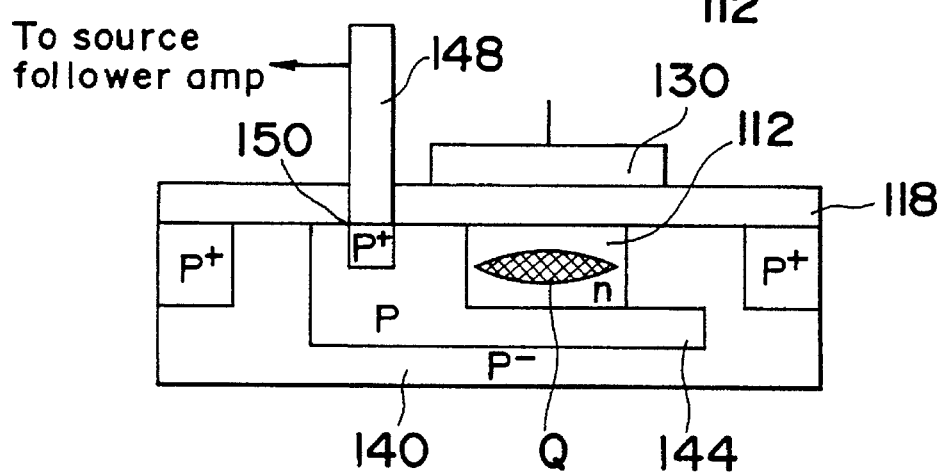

FIG. 4A is a schematic plan view of a charge detection device around a floating gate amplifier of a second embodiment, and FIGS. 4B and 4C are sectional views along C—C' line and along D—D' line in FIG. 4A. In a structure shown in FIGS. 4A–4C, a P⁻ well 140 is formed in a semiconductor substrate, and P wells 142, 146 and a P well 144 are formed in the P⁻ well 140. A P well 142 is formed at a position in correspondence to an output gate 124 and a gate 126 to be formed later. The P well 144 is made of polysilicon and it is formed at a position in correspondence to a bias gate 130 to be formed later, isolated from other P wells. Another P well 146 is formed at a position in correspondence to a reset drain 116 to be formed later.

An n layer 112 is formed on the P wells 142, 144, 146, and an n⁻ region 114 is formed in the n layer 112 at a position below a gate 128 to be formed later and the reset drain 116 of an n⁺ region are formed in the n⁻ layer 112 at an end of the n layer 112. The n layer 112 and the n⁻ region 114 are all buried regions, and signal charge is transferred through them. Next, a gate oxide layer 118 is formed on the n layer 112 and the n⁻ region 114. Further, a reset gate 120, the bias gate 130, the output gate 124 and gates 126, 128 for applying signal øH1 are formed on the gate oxide film 118.

Feature of the second embodiment are that a floating gate is formed by the P well 144, and that the bias gate 130 is made of polysilicon. Because the P⁻ well 140 is almost depleted, the P well 144 is floating. If a distance between the bias gate 130 and the floating gate becomes small, a voltage applied to the bias gate 130 can be decreased. Then, a parasitic capacitance due to the bias gate 130 can be decreased. The bias gate may also be made of a metal such as aluminum or tungsten.

As shown in FIG. 4C, at an end of the P well 144 outside the bias gate 130, a contact hole 148 is formed. Because the P well 144 is made of a P layer, P type impurities such as boron are diffused at a bottom 150 of the contact hole 148 for ohmic contact. The contact hole 148 is filled with a metallic material such as aluminum and it is connected to a source follower of a transistor (not shown). Thus, the source follower is connected to the floating gate 120. Because a distance between the floating gate (the P well 144) and the signal charge Q becomes shorter, a capacitance C1 described in the prior art (FIG. 2) increases. This is equivalent to a reduction of a parasitic capacitance which contributes to charge-to-voltage conversion. Therefore, a sensitivity of charge detection is improved.

EMBODIMENT 3

Figure 5A:
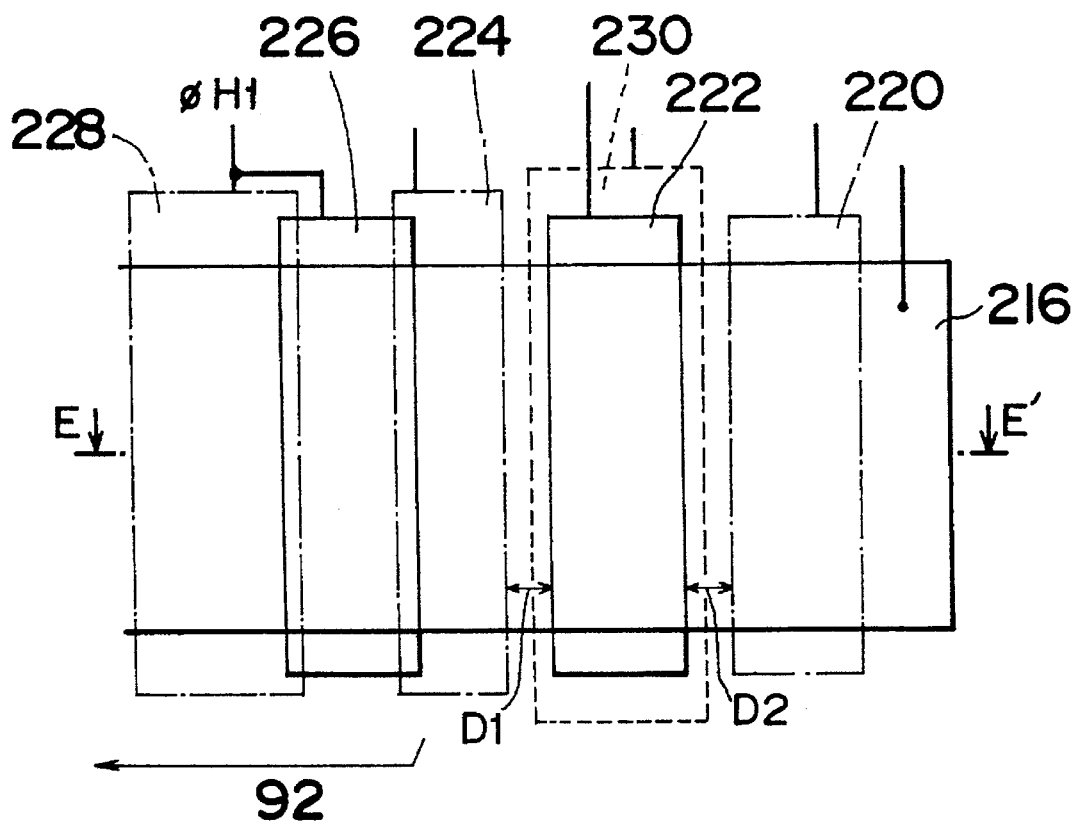
FIG. 5A is a plan view of a charge detecting device around a floating gate amplifier of a third embodiment and FIG. 5B is a sectional view along line E—E' in FIG. 5A.
Figure 5B:
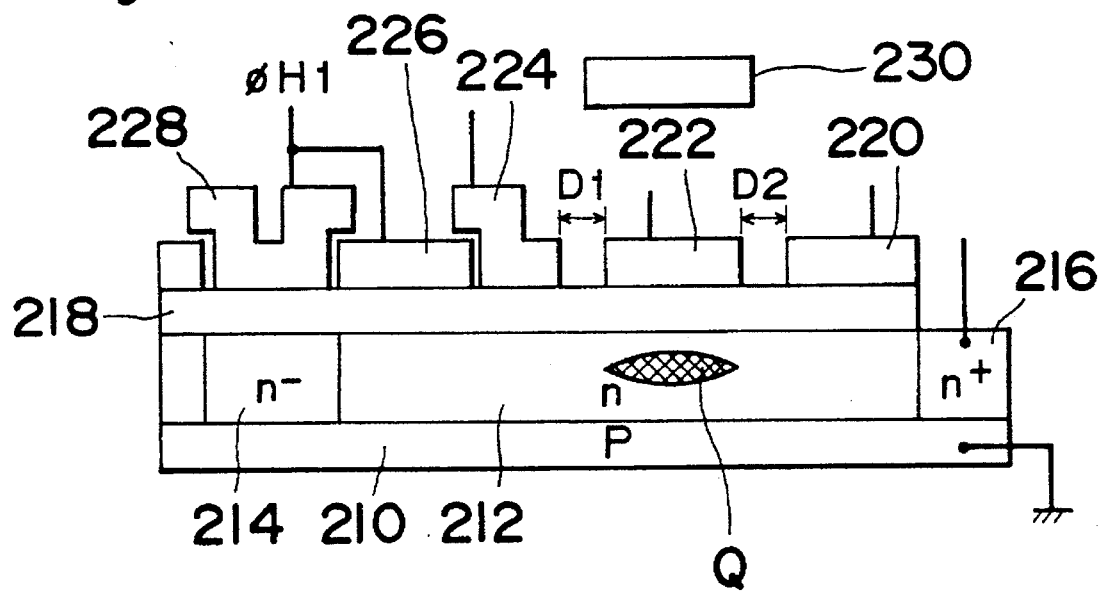

FIG. 5A is a plan view of a floating gate amplifier and thereabout of a third embodiment and FIG. 5B is a sectional view along line E—E' in FIG. 5A. A P well 210 is formed in a semiconductor substrate, and an n layer 212 is formed on the P well 210. An n⁻ region 214 is formed in the n layer 212 at a position below a gate 228 to be formed later, while a reset drain 216 of an n⁺ region is formed at an end of the n layer 212. The n layer 212 and the n⁻ layer 214 are all buried regions, and signal charge is transferred through them. Next, a gate oxide layer 218 is formed on the n layer 212 and the n⁻ layer 214. Further, a reset gate 220, a floating gate 222 for charge detection, an output gate 224 and gates 226, 228 for applying signals øH1 for charge transfer are arranged on the gate oxide film 218. Further, a bias gate 230 is formed via an insulating film above the floating gate 222. A source follower amplifier (not shown) of a transistor is connected to the floating gate 222.

A feature of the third embodiment is that an overlap between the floating gate 222 and the output gate 224 and between the floating gate 222 and the reset gate 220 are eliminated by providing gaps D1, D2 therebetween and that gates 226, 228 for applying øH1 of the HCCD overlap. When the floating gate amplifier is operated, a potential of the floating gate 222 is set to be higher than off potentials of the output gate 224 and the reset gate 220. Because fringing potentials by the bias gate 230 are applied to the gaps D1 and D2, the potentials at the gaps D1 and D2 are intermediate between the potential of the floating gaze 222 and those of the outdoor and reset gates 224, 220. A charge transfer efficiency is decreased by providing the gaps D1 and D2, but only less than 0.1%. Further, by increasing the potential of the bias gate 230, the decrease in charge transfer efficiency can be vanished substantially. At the HCCD 92, an increase in applied voltage increases dissipation of electric power largely. Further, even if the decrease in charge transfer efficiency by 0.1% per stage, if a number of transfer stages is 500 or more, total transfer efficiency is deteriorated largely and the charge coupled device cannot be used practically. Therefore, the gaps are provided only between the floating gate 222 and the output gate 224 and between the floating gate 222 and the reset gate 220. Then, total transfer efficiency is not deteriorated while parasitic capacitances can be decreased. Therefore, a sensitivity of charge detection or the charge detection device is increased.

EMBODIMENT 4

Figure 6A:
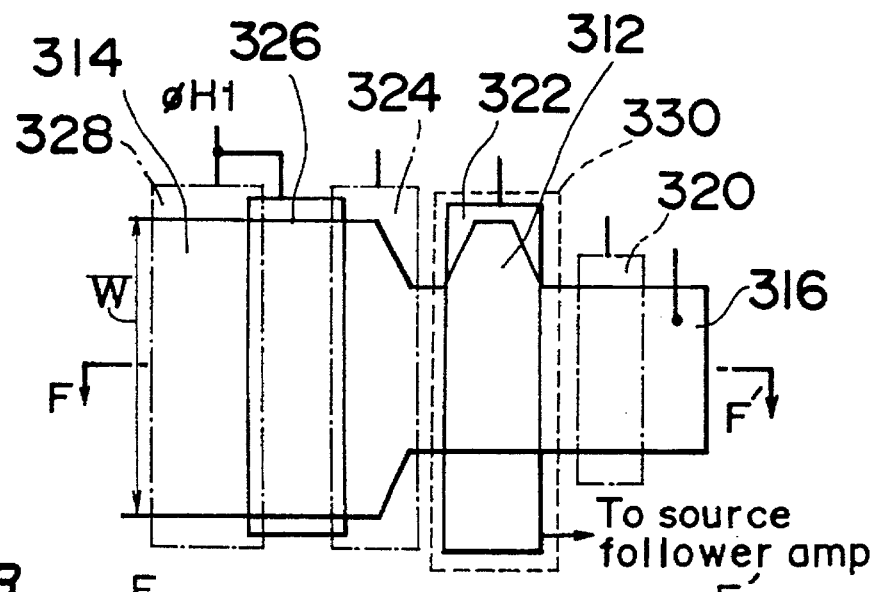
FIG. 6A is a plan view of a charge detecting device around a floating gate amplifier of a fourth embodiment.
Figure 6B:
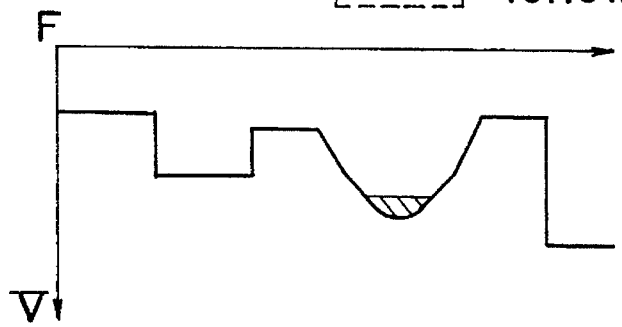
FIG. 6B is a diagram of a potential thereof.

FIG. 6A is a plan view of a floating gate amplifier and thereabout of a fourth embodiment and FIG. 6B is a diagram of a potential thereof. A structure below a gate oxide layer is similar to that of FIG. 3B, and it is explained simply. Above a P well (not shown), an n layer 312, an n⁻ region 314 and a reset drain 316 of an n⁺ region are formed. Next, a gate oxide layer (not shown) is formed on the n layer 312 and the n⁻ layer 314. Further, a reset gate 320, a floating gate 322 for detecting signal charge, an output gate 324 and gates 326, 328 for applying signal øH1 for charge transfer are formed on the gate oxide film. Further, a bias gate 330 is formed via an insulating film (not shown) above the floating gate 322. A source follower amplifier (not shown) of a transistor is connected to the floating gate 322.

A feature of the fourth embodiment is that a high potential portion is provided at the center of the floating gate 322 so as to concentrate signal charge Q there. In an ordinary charge coupled devices, a channel width W is constant in the charge detection section. If the channel width W decreases, a potential decreases due to a narrow channel effect. On the contrary, in the fourth embodiment, the channel width W in the charge detection section is changed as shown in FIG. 6A from a first narrow width portion up to the floating gate 322, through a wide width portion below the floating gate 322 and a second narrow width portion below the reset gate 320. FIG. 6B shows a potential distribution in this case. That is, the potential becomes high at the wide width portion while low at the narrow width portions. Therefore, signal charge Q transferred through the channel is concentrated at the center of the floating gate 322. Because the floating gate 322 is wider than the signal charge Q, it can absorb lines of electric force from the signal charge Q over a wide range. This corresponds to an increase in parasitic capacitance C1 described above on the prior art, and a sensitivity of charge detection is improved.

Figure 6C:
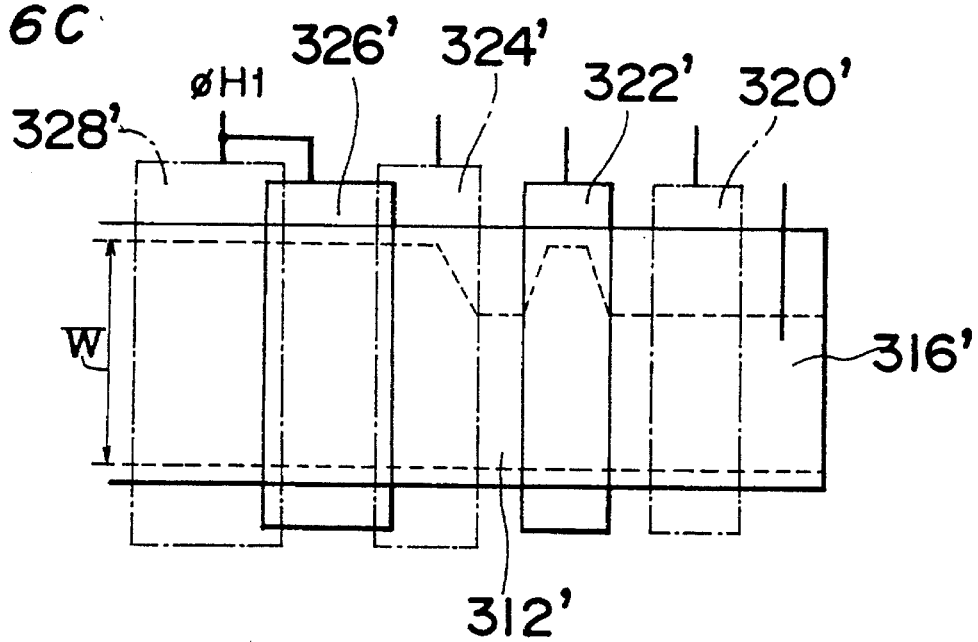
FIG. 6C is a plan view of a modified example of the fourth embodiment.

FIG. 6C is a plan view of a modified example of the fourth embodiment, wherein not a channel width, but a width of an n layer is changed in a charge detection section. That is, above a P well (not shown), an n layer 312', an n⁻ region 314' and a reset drain 316' of an n⁺ region are formed. The width of the n layer 312' and the like is changed as shown in FIG. 6C. Next, a gate oxide layer (not shown) is formed on the n layer 312' and the n⁻ layer 314'. Further, a reset gate 320', a floating gate 322', an output gate 324' and gates 326', 328' for applying signal øH1 are arranged on the gate oxide film. Further, a bias gate 330' is formed above the floating gate 322'. A source follower amplifier (not shown) of a transistor is connected to the floating gate 322'. Then, an effect similar to that of FIG. 6A can be obtained.

EMBODIMENT 5

Figure 7A:
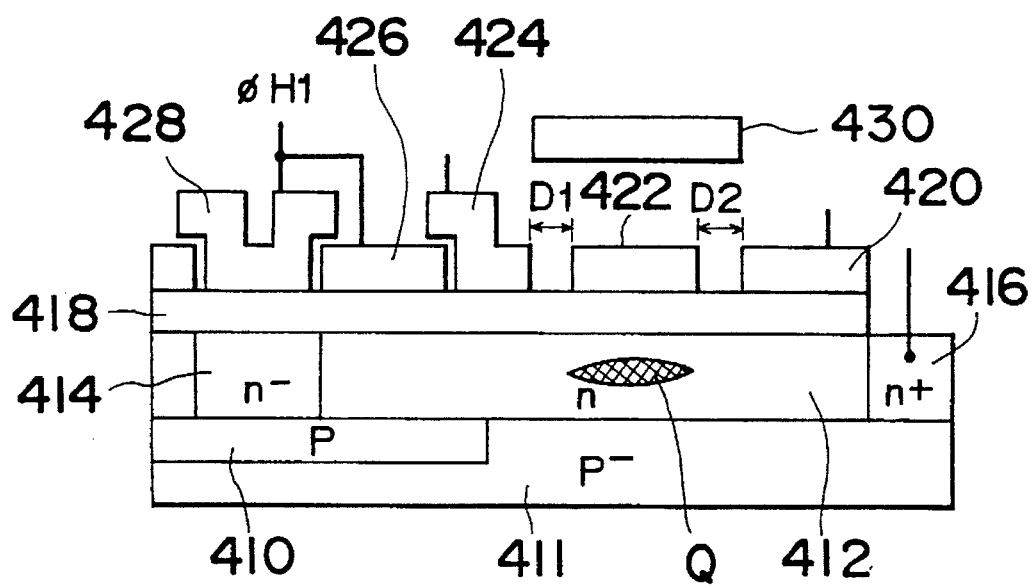
FIGS. 7A and 7B are sectional views of a charge detecting device around a floating gate amplifier of a fifth embodiment.
Figure 7B:
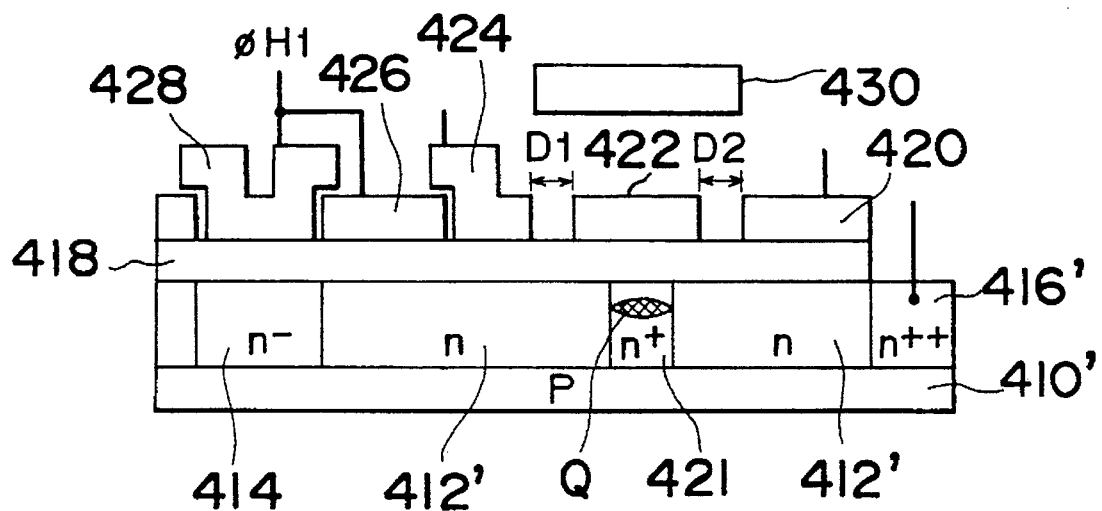

FIGS. 7A and 7B are sectional views of a charge detecting device around a floating gate amplifier of a fifth embodiment. A feature of an example the fifth embodiment shown in FIG. 7A is that an area of a P well 410 is decreased. That is, a P⁻ well 411 is formed on a semiconductor substrate, and the P well 410 is formed only except a charge detection section. Then, an n layer 412 is formed on the P and P⁻ wells 410, 411. Then, an n⁻ region 414 is formed in the n layer 412 at a position below a gate 428 to be formed later, and a reset drain 416 of an n⁺ region is formed at an end of the n layer 412. The n layer 412 and the n⁻ layer 414 are all buried regions, and signal charge is transferred through them. Next, a gate oxide layer 418 is formed on the n layer 412 and the n⁻ layer 414. Further, a reset gate 420, a floating gate 422 for charge detection, an output gate 424 and gates 426, 428 for applying signals øH1 for charge transfer are arranged on the gate oxide film 418. The floating gate 422 does not overlap with the adjacent gates 424 and 420. Further, a bias gate 430 is formed via an insulating film (not shown) above the floating gate 422. A source follower amplifier (not shown) of a transistor is connected to the floating gate 422.

Therefore, the P well 410 is not formed below the floating gate 422, and the P⁻ well 411 is almost depleted. Therefore, parasitic capacitances (in correspondence to C2 in the prior art (FIG. 2)) between the signal charge Q and the P well 410 and between the signal charge Q and the P⁻ well 411 are reduced.

A feature of another example of the fifth embodiment shown in FIG. 7B is that N-type impurities are injected again below the floating gate 422 to form a storage portion 421. That is, a P well 410' is formed in a semiconductor substrate. Then, an n layer 412', an n⁻ region 414, the n⁺ region 421 (storage portion) are formed on the P well 410' and a reset drain 416' of an n⁺⁺ region are formed at an end of the n layer 412'. The n⁺ region 421 is also formed below a floating gate 422. The n⁻ region 414 and the n⁺ region 421 are formed at positions below a gate 428 and below the floating gate to be formed later. The n, n⁻ and n⁺ regions 412', 414 are all buried regions, and signal charge is transferred through them. Next, a gate oxide layer 418 is formed on the n, n⁻ and n⁺ regions 412', 414, 421. Then, various gates 420–430 are formes similar to FIG. 7A.

In the structure shown in FIG. 7B, though the storage portion 421 has a concentration larger than the n layer 412', it is depleted similarly to the n layer 412'. The n⁺⁺ region 416' is represented with "++" because it has a larger concentration than the floating gate though its concentration is about the same as the counterparts in the preceding embodiments. A potential at the storage portion 421 is deeper so that transferred charge is stored here. Further, because the potential at the storage portion is deeper, charge transfer efficiency is not lowered even if a potential of the floating gate 422 is set to be lower than usual. If an area of the storage portion 421 is reduced further, a parasitic capacitance between the signal charge Q and the P well 410' can be reduced.

Figure 8A:
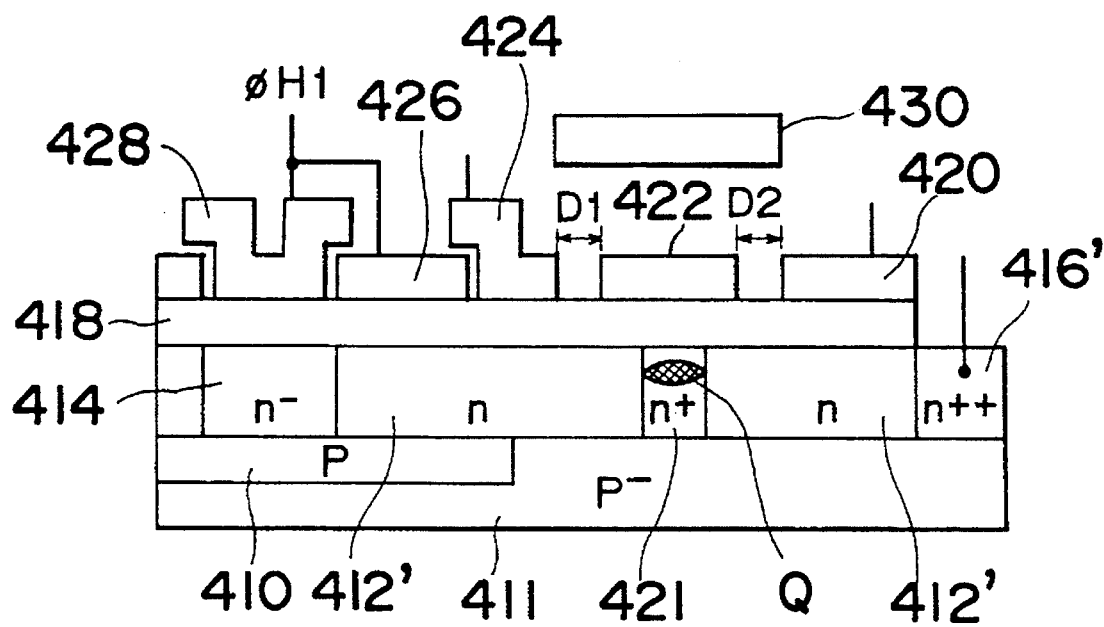
FIGS. 8A and 8B are schematic sectional views of charge detection devices of modified examples of the fifth embodiment of the invention.

FIG. 8A shows a combination of FIGS. 7A and 7B. That is, an area of a P well 410 is decreased by forming the P⁻ cell 411 and the storage portion 421 is formed below the floating gate 422. The parasitic capacitance can be reduced further.

Figure 8B:
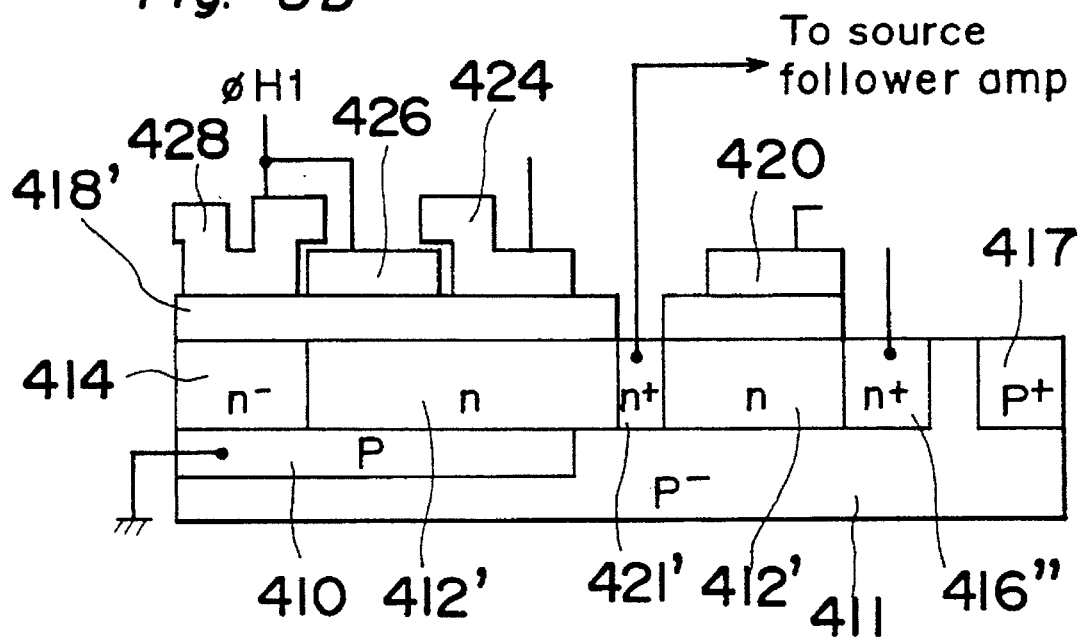

FIG. 8B shows a combination of a floating diffusion amplifier and the reduced P well. The structure of FIG. 8B is different from that of FIG. 8A above the oxide gate layer 418'. A P⁺ region 417 may be formed at the farthest of the n layer 412'. The floating gate 422 and the bias gate 430 are not provided, and an n⁺ region 421' provided as a floating diffusion is connected directly to a source follower amplifier. Because the floating diffusion 421' formed at a position in correspondence to the storage portion 421 does not contact directly with the P well 410, a PN junction capacitance can be reduced than previously.

EMBODIMENT 6

Figure 9:
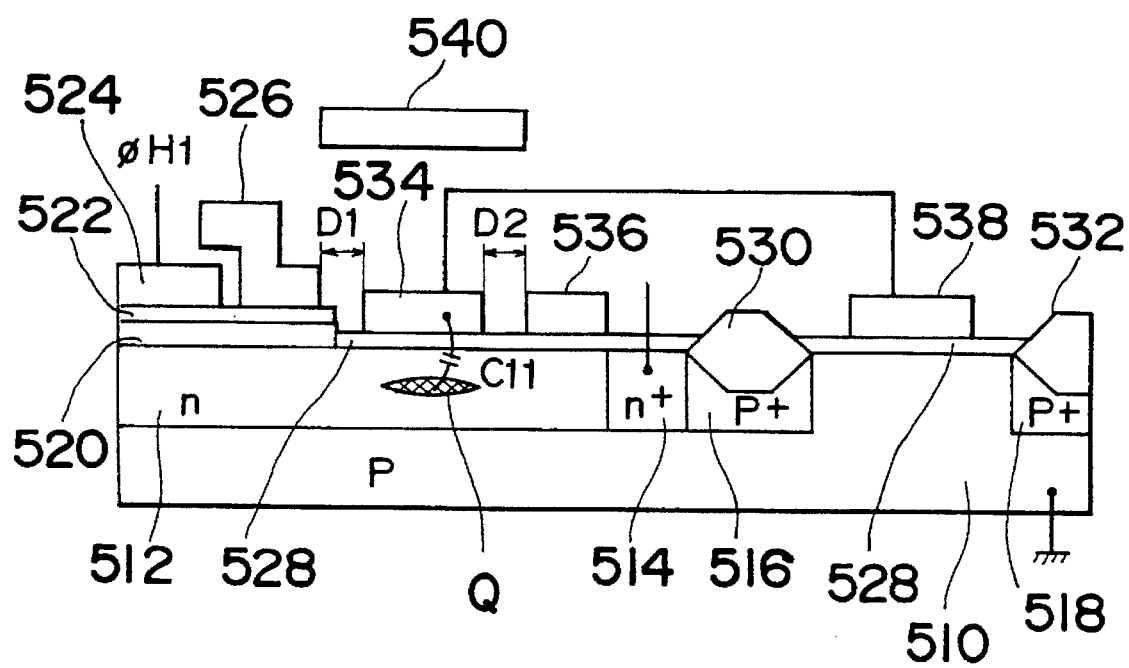
FIG. 9 is a schematic sectional view of a charge detection device of a sixth embodiment of the invention.

FIG. 9 is a schematic sectional view of a charge detection device of a sixth embodiment of the invention. A P well 510 is formed in a semiconductor substrate, and an n layer 512, an n⁺ region 514 and a P⁺ region 516 are formed continuously in the P well 510, and another P⁺ region 518 is formed at an end of the P well 510. Next, oxide film 520 is formed on the layers 512–518 and 510. A silicon nitride film 522 is formed on the oxide film 520. Next, a gate 524 for applying signal øH1 for charge transfer and an output gate 526 are formed on the nitride film 522. Though not shown explicitly in FIG. 9, a thin oxide film exists between the nitride film 522 and the output gate 526. Thus, a gate oxide film consists of three layers of the thin oxide film, the nitride film 522 and the oxide film 520. Next, the gate oxide film is removed in a section in correspondence to a floating gate, a reset gate and a source follower amplifier, and an oxide film 528 is formed. Field oxide films 530, 532 made of thick SiO₂ films are formed with thermal oxidation on the P⁺ regions 516 and 518 through the oxide film 528. A floating gate 534 for charge detection and a reset gate 536 are formed on the oxide film 528 above the n layer 512 between the output gate 526 and the field oxide film 530. The floating gate 534 does not overlap with the output gate 532 and the reset gate 536. Signal charge Q is transferred through the n layer 512 to below the floating gate 534. Further, a gate 538 is formed on the oxide film 528 between the field oxide films 530 and 532, and the gate 538 corresponds to a first stage transistor of a source follower amplifier. Further, a bias gate 540 is formed via an insulating film (not shown) above the floating gate 532.

Figure 2:
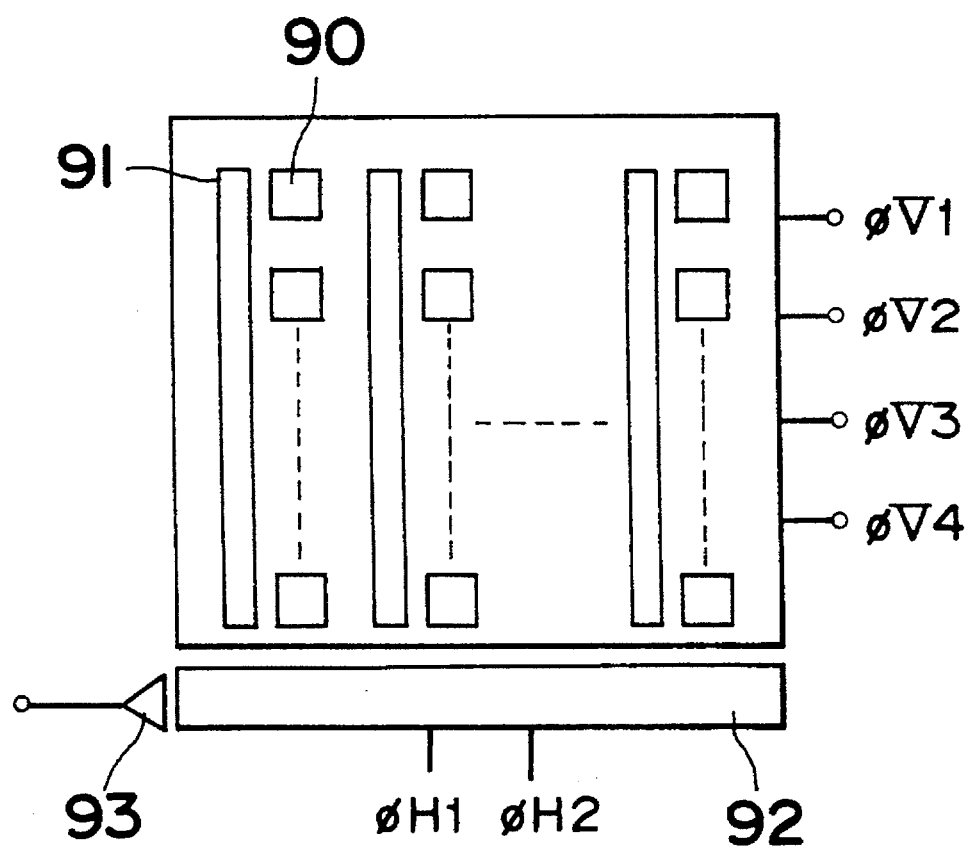
FIG. 2 is a schematic diagram of a charge coupled device with a floating gate amplifier.

A feature of the sixth embodiment is that an effective thickness of the gate oxide film for the floating gate 534, the reset gate 536 and the gate 538 is smaller than that of the HCCD 92 and the VCCD 91 in the prior art shown in FIG. 2. Therefore, a parasitic capacitance between the floating gate 534 and the signal charge Q increases more than previously, and this improves a sensitivity of charge detection.

Further, when a reset pulse is applied to the reset gate, a voltage applied to the surface of silicon is enhanced because the thickness of the oxide film 528 becomes smaller. Therefore, a voltage of reset pulse can be decreased, and this makes it possible to adopt a simpler driver for reset pulse. In the source follower amplifier (whose gate 538 is shown in FIG. 9), a gain thereof increases because a mutual conductance of each transistor increases to improve a sensitivity of charge detection eventually. Though the sixth embodiment is explained on a floating gate amplifier, it would be understood easily by a person skilled in the art that it can also be applied to a floating diffusion amplifier similarly by decreasing an effective thickness of the gate oxide film.

EMBODIMENT 7

Figure 10A:
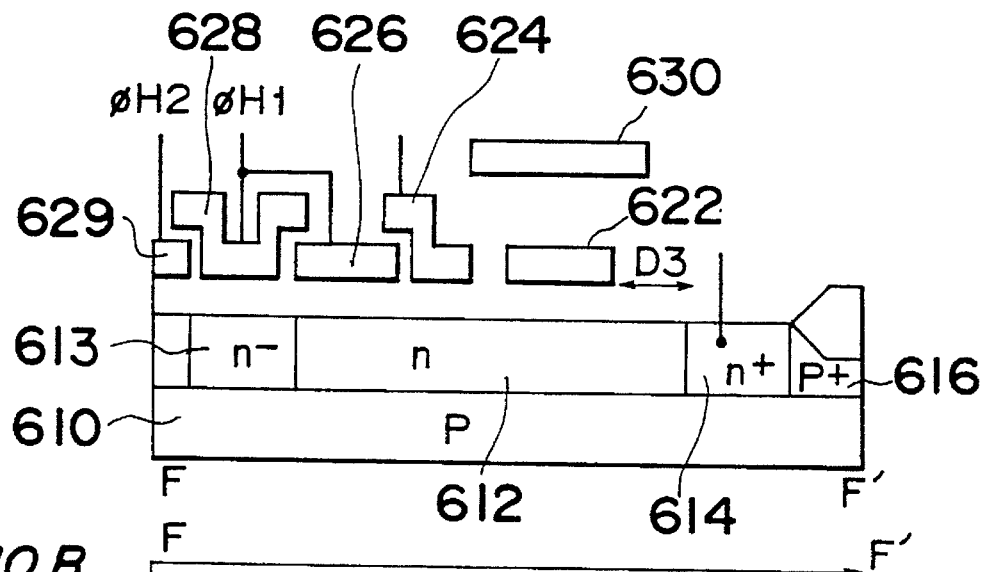
FIG. 10A is a schematic sectional view of a charge detection device of a seventh embodiment of the invention.

FIG. 10A is a schematic sectional view of a charge detection device of a seventh embodiment of the invention. A feature of the seventh embodiment is that reset is operated by applying a pulse of the same phase as øH1 to the reset drain, without forming a reset gate.

A structure shown in FIG. 10A is explained first. A P well 610 is formed in a semiconductor substrate, and an n layer 612 is formed on the P well 610. Then, an n⁺ layer 613 is formed in the n layer 612, while a reset drain 614 of an n⁺ region are formed at an end of the n layer 612. Further, a P⁺ region 616 is formed adjacent to the n⁺ layer 614. Signal charge is transferred through the layers 612–616. Further, a floating gate 622 for charge detection, an output gate 624 and gates 626, 628, 629 for applying signals øH1 and øH2 for charge transfer are arranged on a gate oxide film formed on the n layer 612. The floating gate 622 does not overlap with the output gate 624. Further, a bias gate 630 is formed via an insulating film above the floating gate 622. A source follower amplifier (not shown) of a transistor is connected to the floating gate 622.

A space represented as D3 exists between the floating gate 622 and the reset drain 614. It should be noted that the space is not used for forming any gate including a reset gate and that the bias gate 630 does not cover the empty space completely.

Figure 10B:
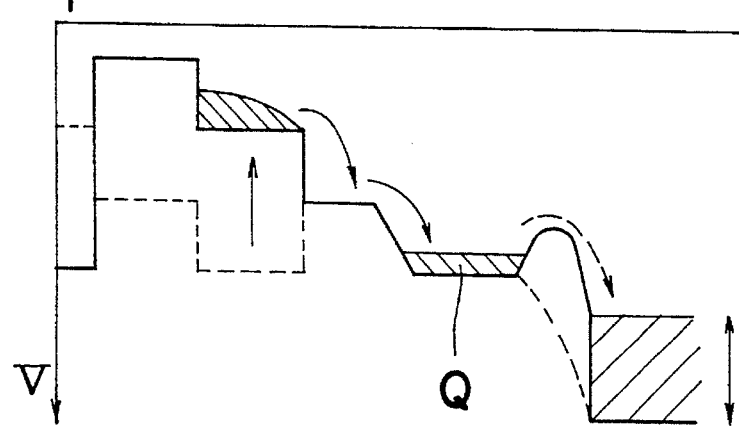
FIG. 10B is a diagram of a potential of the device and FIG. 10C is a timing chart thereof.
Figure 10C:
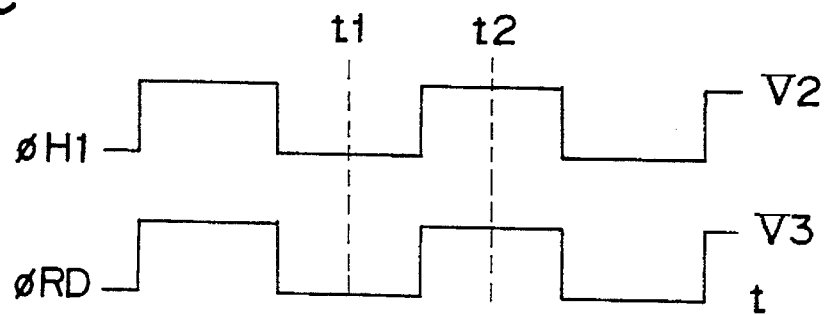

FIG. 10B shows a diagram of a potential of the device and FIG. 10C shows a timing chart of øH1 and øRD for reset, wherein øRD denotes a signal applied to the reset drain 614. In FIG. 10B, a solid line represents a state at a time t1 while a dashed line represents a state at time t2 along a path F—F'. FIG. 10B shows that a potential gap exists at time t1 between the floating gate 622 and the reset drain 614 when a LOW level driving signal which is not equal to zero is applied to the reset drain 614. At the time t2, a high level signal V3 is applied to the reset drain 614 and the potential gap disappears so that the signal charge Q which has been transferred below the floating gate 622 is absorbed by the reset drain 614. Though signals øH1 and øRD have the same phase each other, high levels thereof are different from each other. Because a reset gate is not provided, an excessive parasitic capacitance can be removed, and a sensitivity of charge detection is improved. Though the seventh embodiment is explained on a floating gate amplifier, it would be understood easily by a person skilled in the art that it can also be applied to a floating diffusion amplifier similarly by decreasing an effective thickness of the gate oxide film.

EMBODIMENT 8

Figure 11A:
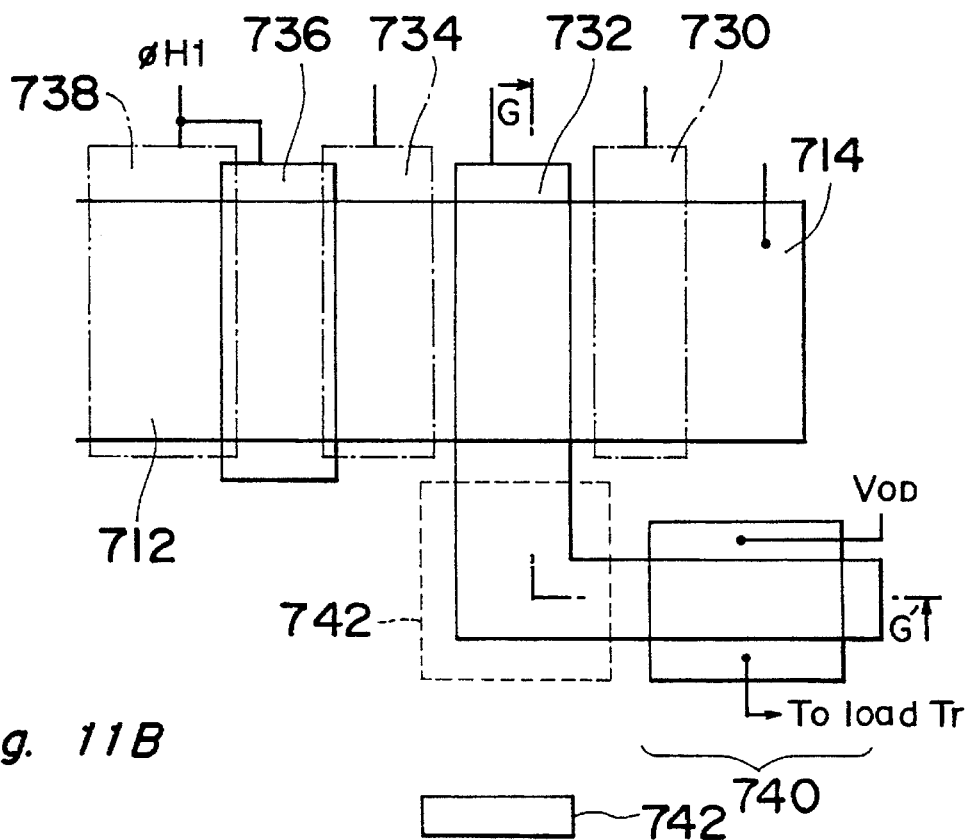
FIG. 11A is a plan view of a charge detecting device around a floating gate amplifier of an eighth embodiment and FIG. 11B is a sectional view along line G—G' in FIG. 11A.
Figure 11B:
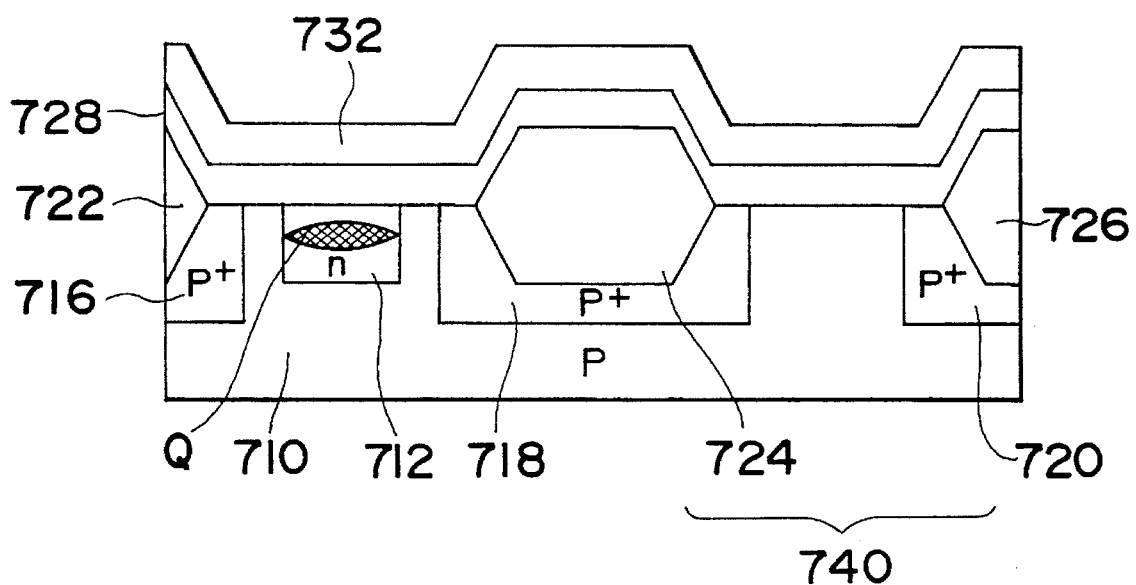

FIG. 11A is a plan view of a charge detecting device around a floating gate amplifier of an eighth embodiment and FIG. 11B is a sectional view along line G—G' in FIG. 11A. In a structure shown in FIGS. 11A and 11B, a P well 710 is formed in a semiconductor substrate, and an n layer 712 and a reset drain 714 are formed on the P well 710. Further, P⁺ regions 716, 718 and 720 are formed as shown in FIG. 11B along a path G—G', and field oxide films 722, 724 and 726 made of thick SiO₂ films are formed with thermal oxidation on the P⁺ regions 716, 718 and 720. Next, a gate oxide layer 728 is formed on the P well 710, the n layer 712 and the P⁺ regions 716, 718 and 720. Further, a reset gate 730, a floating gate 732, an output gate 734 and gates 736, 738 for applying signal øH1 are formed on the gate oxide film 728. The floating gate 732 does not overlap with the reset gate 730 and the output gate 734. It is to be noted that the floating gate 732 extends outside the channel or n layer 712 and is connected to a first stage 740 of transistor of a source follower amplifier. Then, a bias gate 742 is formed via an insulating film above the floating gate 732.

A feature of the eighth embodiment is that an overlap portion between the bias gate 742 and the floating gate 732 is formed on the field oxide film 724 outside the channel or n layer 712. If an etching boundary of aluminum is formed on a channel (n layer), a leakage current is liable to increase between a floating gate and the bias gate and between the floating gate and the n layer. In the present embodiment, even if an etching end of aluminum is formed on the field oxide film 724, the leakage current is reduced largely. However, if an overlap area between the floating gate 732 and the bias gate 742 is kept the same as the prior art, the parasitic capacitance and the DC potential of the floating gate 732 do not change.

EMBODIMENT 9

Figure 12A:
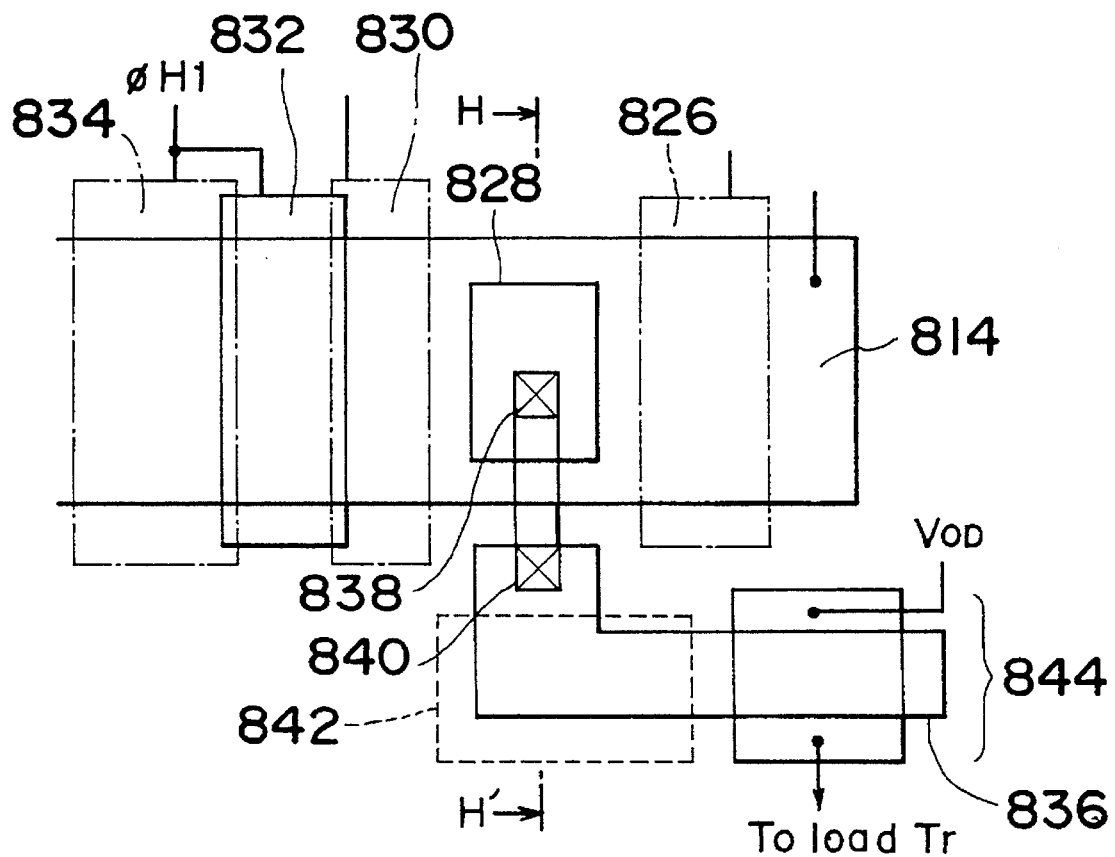
FIG. 12A is a plan view of a charge detecting device around a floating gate amplifier of a ninth embodiment and FIG. 12B is a sectional view along line H—H' in FIG. 12A.
Figure 12B:
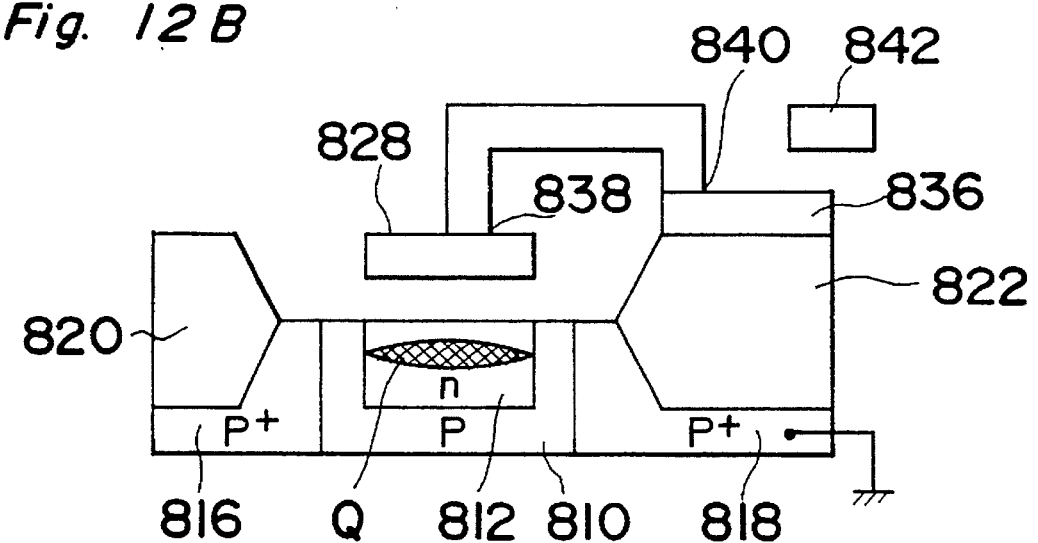

FIG. 12A is a plan view of a charge detecting device around a floating gate amplifier of a ninth embodiment and FIG. 12B is a sectional view along line H—H' in FIG. 12A. In a structure shown in FIGS. 12A and 12B, a P well 810 is formed in a semiconductor substrate, and an n layer 812 and a reset drain 814 are formed on the P well 810. Further, $P^+$ regions 816 and 818 are formed as shown in FIG. 12B along a path H—H', and field oxide films 820 and 822 made of thick $SiO_2$ films are formed with thermal oxidation on the $P^+$ regions 816 and 818 outside the n layer 812. Then, a reset gate 826, a floating gate 828, an output gate 830 and gates 832 and 834 for applying signal øH1 are formed above the n layer 812 via an insulating layer. The floating gate 828 is formed only in a region (buried channel) to which signal charge is transferred, and it does not overlap with the reset gate 826 and the output gate 830. Further, a gate 836 is formed on the oxide layer 822. Then, contact holes 838 and 840 are formed on the floating gate 828 and the gate 836, and the floating gate 828 and the gate 836 are connected with aluminum and has the same potential each other. Next, a bias gate 842 is formed via an insulating film above the gate 836 connected electrically to the floating gate 828. The gate 836 is connected to a first stage 844 of transistor of a source follower amplifier.

A feature of the ninth embodiment is that the floating gate 828 is formed only in a region (buried channel) to which signal charge Q is transferred. Further, contact holes 838, 840 are formed to connect the floating gate 828 to the gate 836. The bias gate 842 overlaps with the gate 836 above the field oxide film 822 to provide operation potentials to the floating gate 828 and the gate 836. Therefore, parasitic capacitances between the floating gate 828 and the P well 810 and between the floating gate 828 and the $P^+$ regions 816, 818 are reduced to improve a sensitivity of charge detection.

EMBODIMENT 10

Figure 13A:
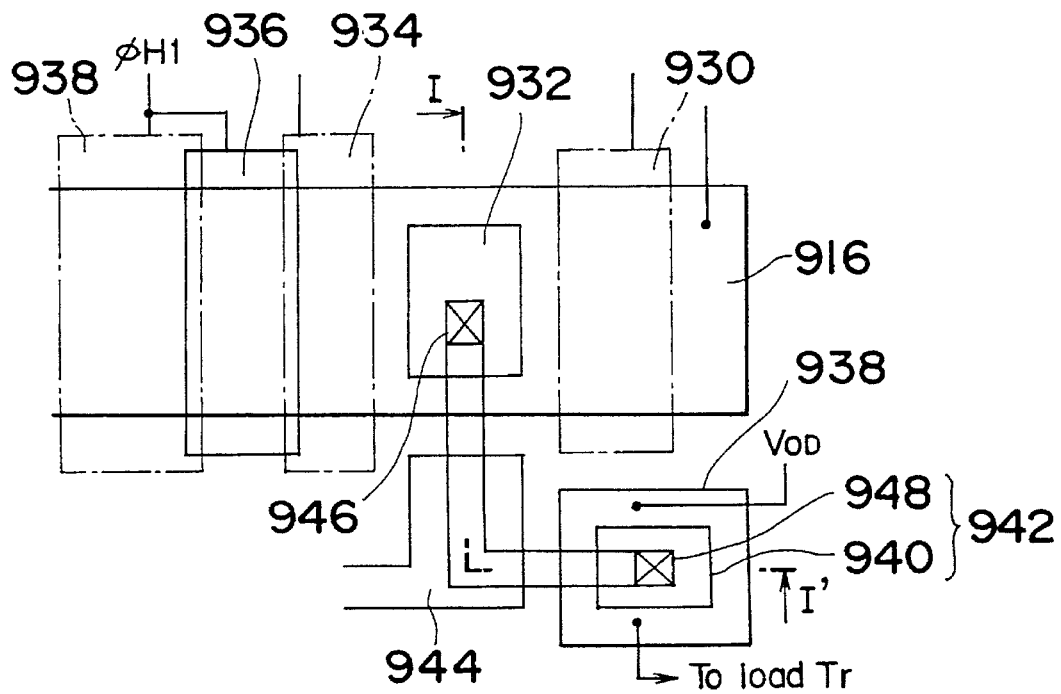
FIG. 13A is a plan view of a charge detecting device around a floating gate amplifier of a tenth embodiment and FIG. 13B is a sectional view along line I—I' in FIG. 13A.
Figure 13B:
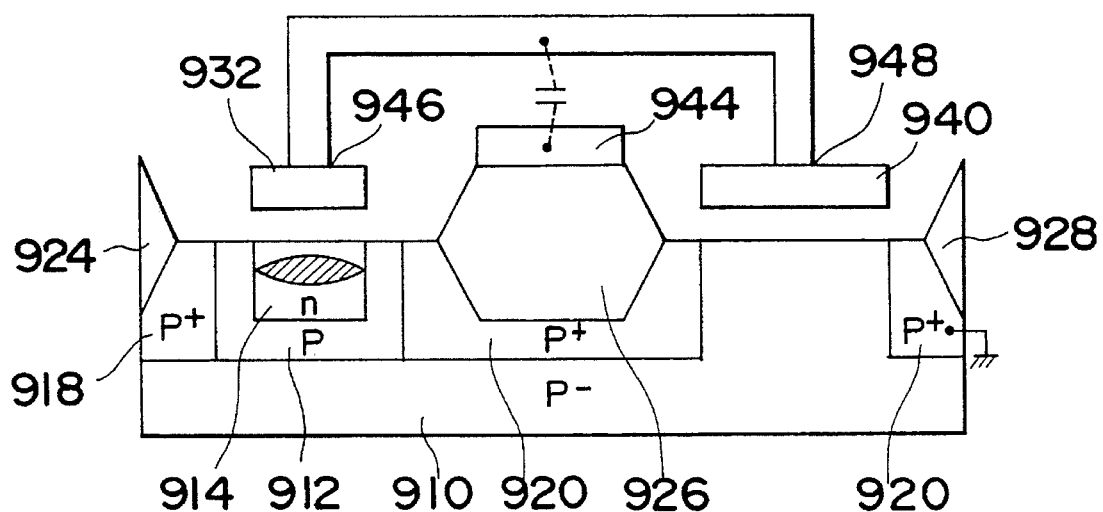

FIG. 13A is a plan view of a charge detecting device around a floating gate amplifier of a tenth embodiment and FIG. 13B is a sectional view along line I—I' in FIG. 13A. In a structure shown in FIGS. 13A and 13B, a $P^-$ well 910 is formed in a semiconductor substrate, and a P well 912 is formed in the $P^-$ well 910. Then, an n layer 914 and a reset drain 916 are formed in the $P^-$ well 910. Further, $P^+$ regions 918, 920 and 922 are formed as shown in FIG. 13B along a path I—I', and field oxide films 924, 926 and 928 made of thick $SiO_2$ films are formed with thermal oxidation on the $P^+$ regions 918, 920 and 922 outside the n layer 914. Then, a reset gate 930, a floating gate 932, an output gate 934 and gates 936 and 938 for applying signal øH1 are formed above the n layer 914 via an insulating layer. The floating gate 932 is formed only in a region (buried channel) to which signal charge is transferred, and it does not overlap the reset gate 930 and the output gate 934, similarly to the ninth embodiment. Further, a gate 940 is formed above the $P^-$ well 910 in an active region of a transistor 942 of a first stage. A bias gate 944 made of polysilicon is formed on the field oxide film 926 outside the n layer 914. On the other hand, contact holes 946 and 948 are formed on the floating gate 932 and the gate 940, and the floating gate 932 and the gate 940 are connected with aluminum and has the same potential each other. The first stage transistor 942 of a source follower amplifier is connected to a load transistor thereof.

A feature of the tenth embodiment is that the bias gate 944 overlaps with the floating gate 932 or a viahole between the contact holes 946 and 948 to provide operation potentials to the floating gate 932 and the gate 940. When the first stage transistor 942 is formed, because the $P^+$ layer 920 below the field oxide film 926 is expanded laterally, a region which functions as a transistor is narrowed. Then, in the present embodiment, the gate 940 is formed as an active region of transistor above a region having the $P^-$ well 910 on the surface thereof. The gate 940 is connected via the contact holes 948, 946 to the floating gate 932. Therefore, parasitic capacitances between the floating gate 932 or the gate 940 and the $P^-$ well 910 or the P well 912 are reduced. Further, because the floating gate 932, the gate 940 and the bias gate 944 are all made of polysilicon and the bias gate 944 is formed on the field oxide film 926, a parasitic capacitance in correspondence to prior art C4 (FIG. 2) can be vanished substantially. Thus, parasitic capacitances are reduced largely to improve a sensitivity of charge detection. Further, because the bias gate 944 is formed below the aluminum viahole, the parasitic capacitance C4 vanishes practically, the potential of the floating gate 932 becomes near that of the bias gate 944. Therefore, the control of the floating gate by the bias gate 944 becomes easier so that the potential of the bias gate can be decreased. Therefore, the leakage current can be reduced further.

Figure 14A:
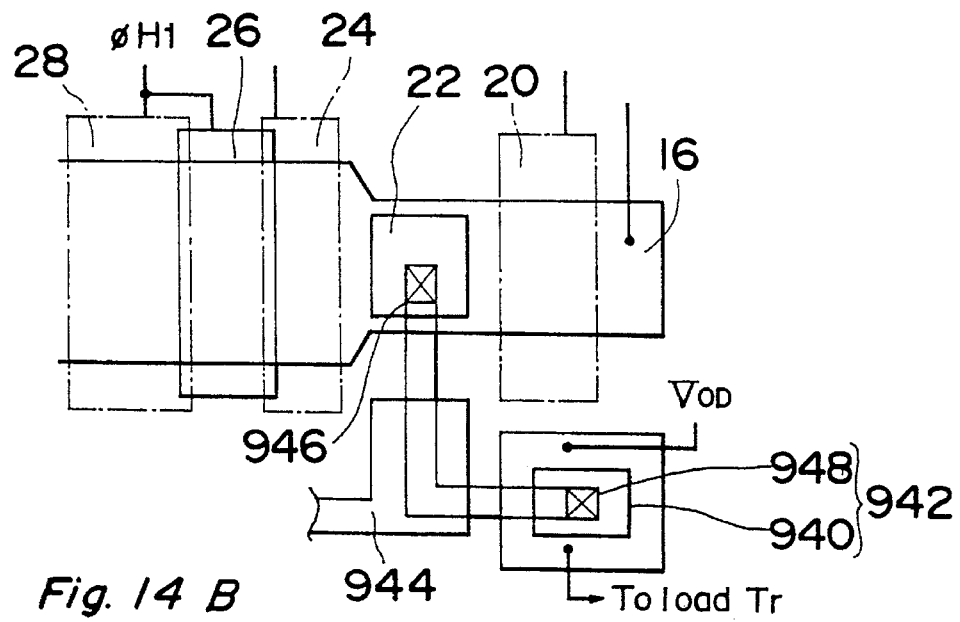
FIG. 14A is a schematic plan view of a charge detection device of an example of a combination of first and tenth embodiments.
Figure 14B:
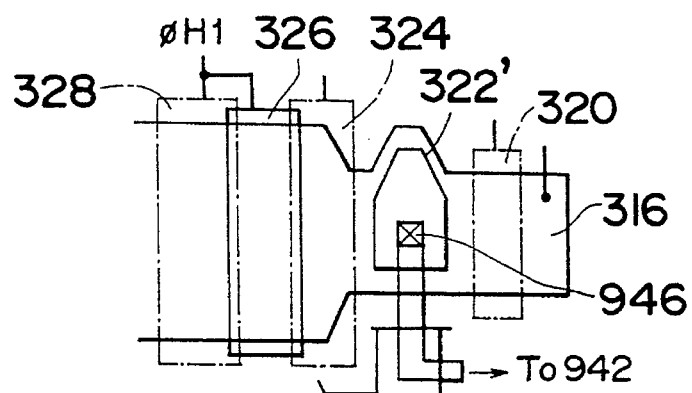
FIG. 14B is a schematic plan view of a charge detection device or an example of a combination of fourth and tenth embodiments.
Figure 14C:
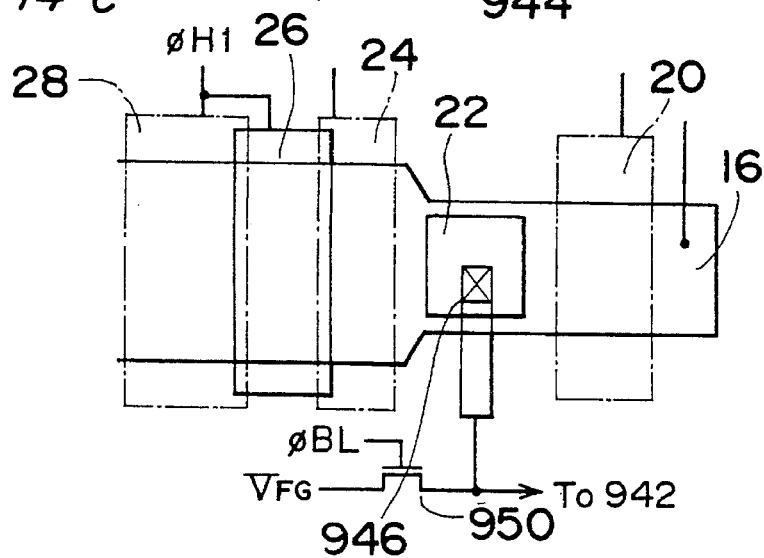
FIG. 14C is a schematic plan view of a charge detection device of a modified example of FIG. 13A.

FIGS. 14A shows a schematic plan view of a charge detection device of an example of a combination of the first and tenth embodiments. FIG. 14B shows a schematic plan view of a charge detection device of an example of a combination of the fourth and tenth embodiments. In the two examples, a bias gate 944 is provided outside the n layer. They have advantages of the above-mentioned two embodiments at the same time respectively. Finally, FIG. 14C shows a modified example of FIG. 14A wherein a transistor 950 is used instead of the bias gate 952. In the example, øBL becomes active only in the horizontal and vertical blanking periods, and the floating gate 22 is set at a voltage $V_{FG}$. Then, if the charge coupled device is operated, the potential of the floating gate 22 is reset periodically at $V_{FG}$. It is understood that the transistor 950 may also be used instead of the bias gate in other embodiments.

EMBODIMENT 11

Figure 15:
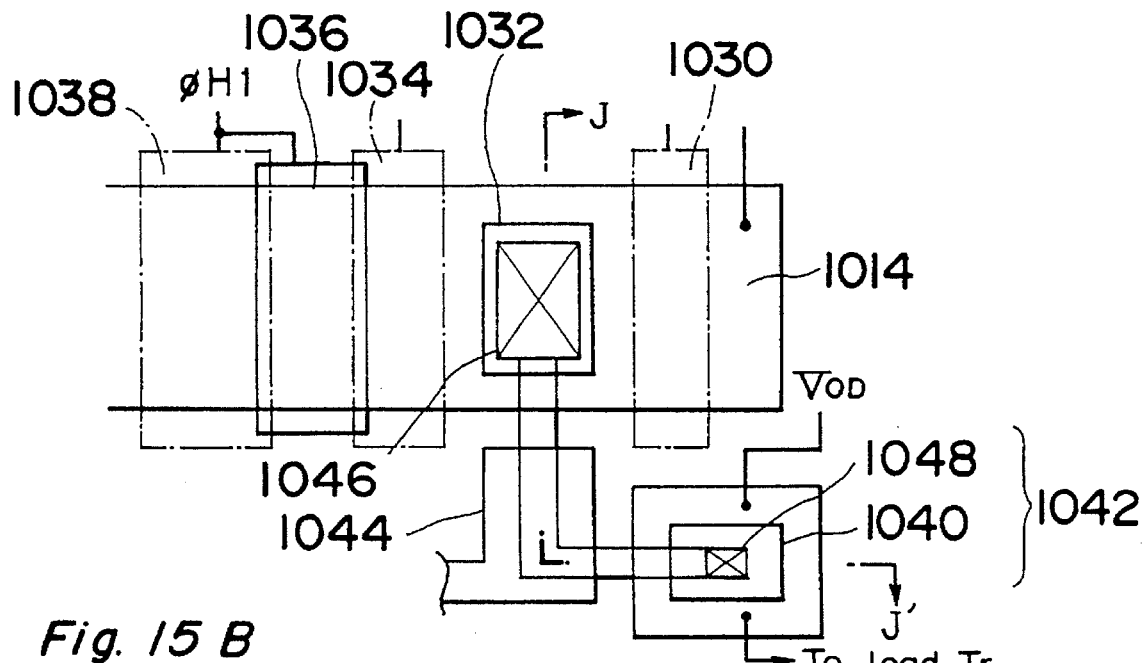
FIG. 15A is a schematic sectional view of a charge detection device of an eleventh embodiment of the invention.
FIG. 15B is a sectional view along line J—J' in FIG. 15A
FIG. 15C is a sectional view along line J—J' of a modified example.
Figure 15:
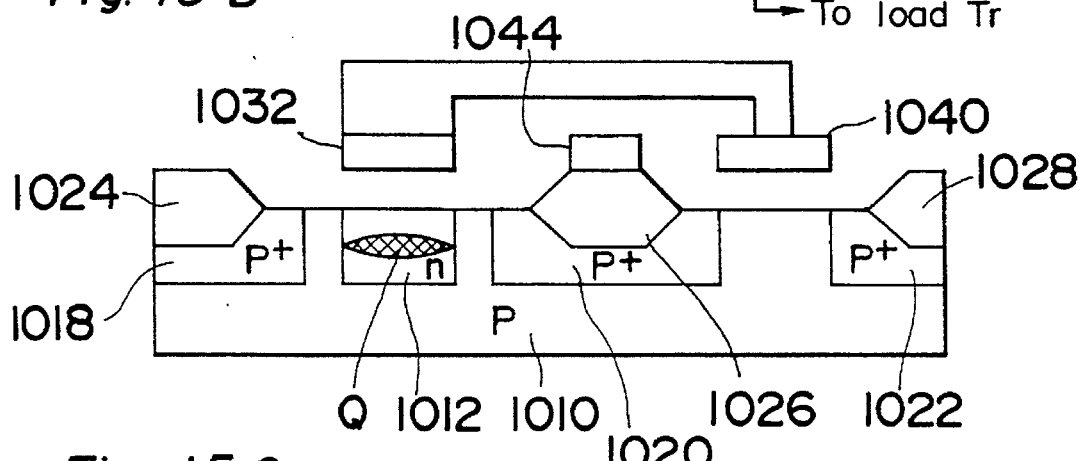
Figure 15:
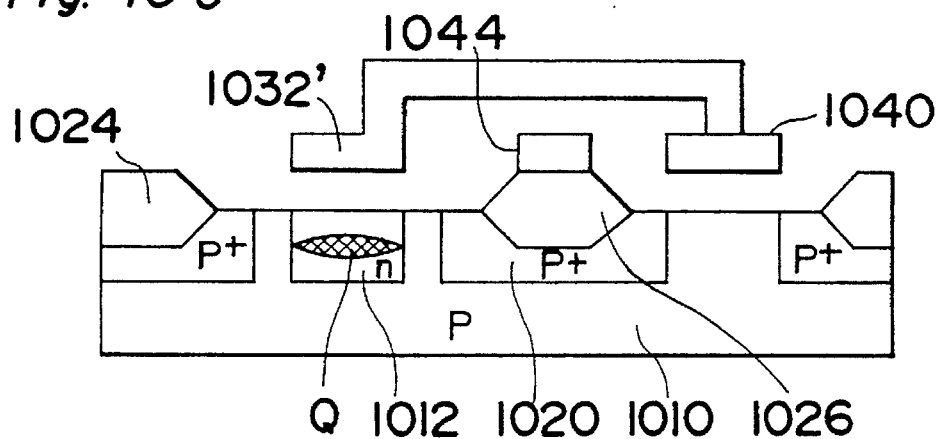

FIG. 15A is a schematic sectional view of a charge detection device of an eleventh embodiment of the invention, FIG. 15B is a sectional view along line J—J' in FIG. 15A. A structure shown in FIGS. 15A and 15B is similar to that of the tenth embodiment (FIGS. 13A and 13B) except a charge detection section. A P well 1010 is formed in a semiconductor substrate, and an n layer 1012 and a reset drain 1014 are formed in the P well 1010. Further, P⁺ regions 1018, 1020 and 1022 are formed as shown in FIG. 15B along a path J—J', and field oxide films 1024, 1026 and 1028 made of thick $SiO_2$ films are formed with thermal oxidation on the P⁺ regions 1018, 1020 and 1022 outside the n layer 1012. Then, a reset gate 1030, a floating gate 1032, an output gate 1034 and gates 1036 and 1038 for applying signal øH1 are formed above the n layer 1012 on an insulating layer. The floating gate 1032 is formed only in a region (buried channel) to which signal charge is transferred, and it does not overlap with the reset gate 1030 and the output gate 1034, similarly to the ninth embodiment. Further, a gate 1040 is formed above the P well 1010 in an active region of a transistor 1042 of a first stage. A bias gate 1044 made of polysilicon is formed on the field oxide film 1026 outside the n layer 1012. On the other hand, contact holes 1046 and 1048 are formed on the floating gate 1032 and the gate 1040. It is to be noted that an area of the contact hole 1046 is almost equal to that of the floating gate 1032. The floating gate 1032 and the gate 1040 are connected with aluminum and has the same potential each other. The first stage transistor 1042 of a source follower amplifier is connected to a load transistor thereof.

A feature of the tenth embodiment is a structure of the charge detection section which is made of metal or polysilicon with a metal at the back side thereof. In order to improve signal detection efficiency, it is needed to absorb all lines of electric force originating from signal charge Q by a floating gate. However, if a floating gate is made of polysilicon, a part of the lines of electric force cannot be absorbed by the floating gate. Then, in the present embodiment, the size of the contact hole 1046 is expanded almost to that of the floating gate 1032. The floating gate 1032 is connected to the gate 1046 via the contact holes 1046, 1048. Therefore, almost all lines of electric force are absorbed by the charge detection section 1032, 1040. This means that the parasitic capacitance C1 in FIG. 2 increases. Then, a sensitivity of charge detection is improved.

FIG. 15C is a sectional view along line J—J' of a modified example which is different from the above example only in a point that a floating gate 1032' is made of a metal such as aluminum, tungsten and titanium. A viahole from the floating gate 1032 to the contact hole 1048 is connected directly to the floating gate 1032'.

EMBODIMENT 12

Figure 16A:
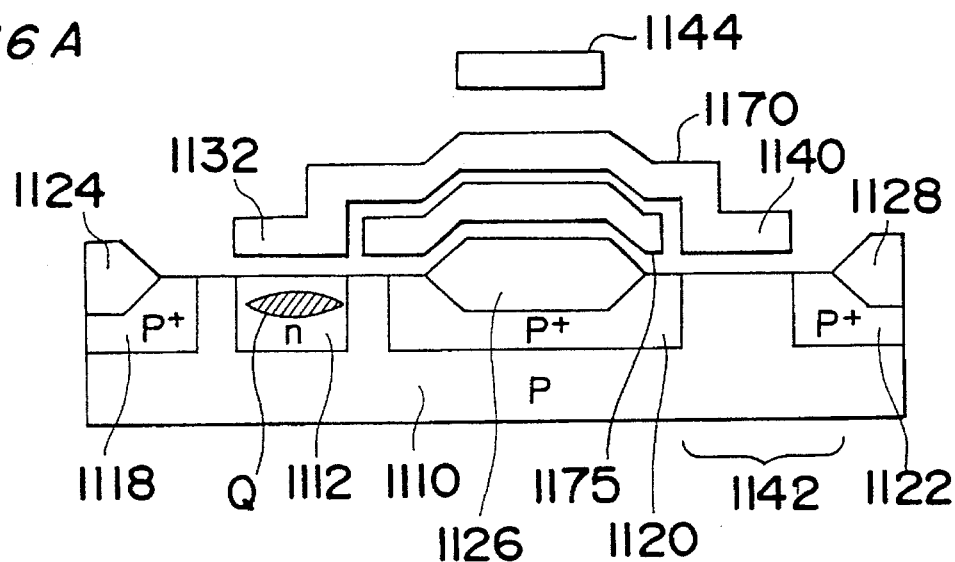
FIGS. 16A and 16B are schematic sectional views of charge detection devices of first and second examples of a twelfth embodiment of the invention.
Figure 16B:
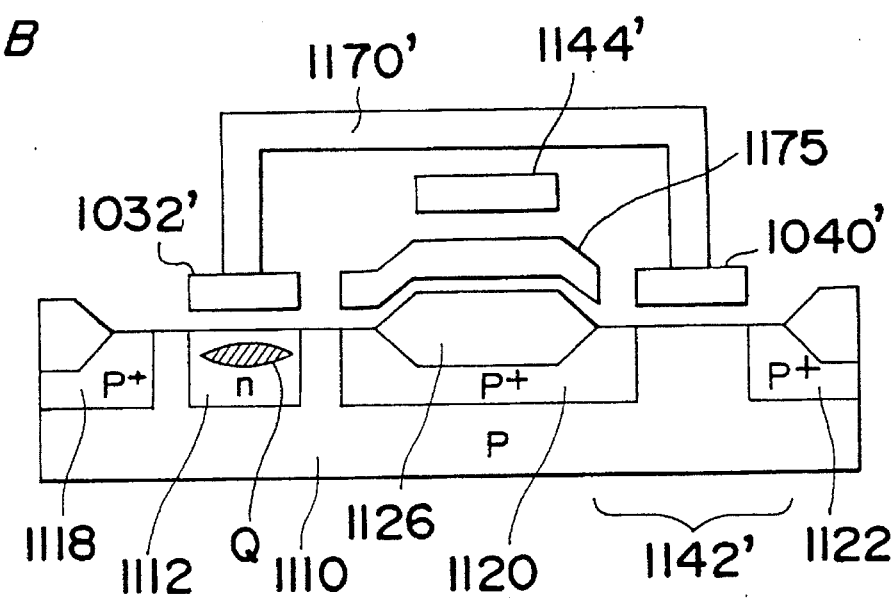

FIGS. 16A and 16B are schematic sectional views of charge detection devices of first and second examples of a twelfth embodiment of the invention. In a structure shown in FIGS. 16A, a P well 1110 is formed in a semiconductor substrate. Then an n layer 1112 and a reset drain (not shown) are formed in the P well 1110. Further, P⁺ regions 1118, 1120 and 1122 are formed as shown in FIG. 16B along a path across the n layer 1112. Field oxide films 1124, 1126 and 1128 made of thick $SiO_2$ films are formed with thermal oxidation on the P⁺ regions 1118, 1120 and 1122 outside the n layer 1012. Then, a reset gate (not shown), a floating gate 1132, an output gate (not shown) and gates (not shown) for applying signal øH1 are formed above the n layer 1112 via an insulating layer. The floating gate 1132 is formed only in a region (buried channel) to which signal charge is transferred, and it does not overlap with the reset gate and the output gate, similarly to the ninth embodiment. Further, a gate 1140 made of polysilicon is formed above the P well 1110 in an active region of a transistor 1142 of a first stage and it also operates as a component of a first stage transistor.

A gate 1175 is formed above the field oxide film 1126 via an insulating film. Further, an electrically conductive line 1170 made of metal is formed above the gate 1175 and connects the floating gate 1132 and the gate 1040. Then, a bias gate 1144 made of polysilicon is formed above the field oxide film 1126. The bias gate 1144 is connected electrically to the gate 1175. The first stage transistor 1142 of a source follower amplifier is connected to a load transistor thereof.

A feature of the twelfth embodiment is that the polysilicon gate 1175 connected to the bias gate 1144 electrically is formed below the electrically conductive line 1170 connecting the floating gate 1132 and the gate 1140 of the source follower amplifier. The gate 1175 is formed below the conductive line or the gate 1170 to cover the field oxide film 1126 and the P⁺ region 1110. Further, the bias gate 1144 is formed above the gate 1170 with aluminum. Because the gate 1175 is connected electrically to the bias gate 1144, the gate 1170 is interposed with conductors of the same potential. In this case, the potential of the gate 1170 in a floating state comes towards the potential of the bias gate 1144 more than prior art. Therefore, a voltage to be applied to the bias gate 1144 can be decreased. Thus, the leakage current can be reduced.

Further, if the gate 1170 is connected to the source of the first stage transistor 1142, the capacitance C4 (FIG. 1B) is enhanced by (1−G) wherein G denotes a gain of the source follower amplifier. Then, the parasitic capacitance is decreased to improve sensitivity of charge detection.

FIG. 16B shows another example wherein a bias gate 1144' made of polysilicon is formed above the gate 1175. On the other hand, a gate 1040' of a first stage transistor 1142' and a floating gate 1132' are connected with an aluminum line 1170 located above the bias gate 1144'. In this case too, the parasitic capacitance is decreased to improve sensitivity of charge detection. It is easily understood that the gate 1175 and the bias gate 1144, 1144' may be reversed upside down.

EMBODIMENT 13

Figure 17A:
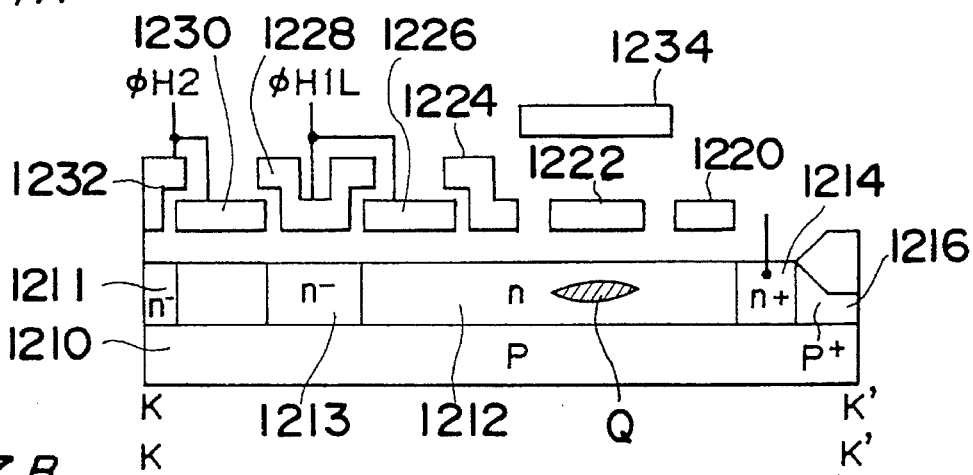
FIG. 17A is a sectional view of a charge detection device of a thirteenth embodiment of the invention.

FIG. 17A is a sectional view of a charge detection device of a charge coupled device of a thirteenth embodiment of the invention. A structure shown in FIG. 17A is explained first. A P well 1210 is formed in a semiconductor substrate, and an n layer 1212 is formed on the P well 1210. Then, n⁻ layers 1211 and 1213 are formed in the n layer 1212, while a reset drain 1214 of an n⁺ region are formed an end of the n layer 1212. Further, a P⁺ region 1216 is formed adjacent to the n⁺ layer 1214. Signal charge is transferred through the layers 1211–1214. Further, a reset gate 1220, a floating gate 1222 for charge detection, an output gate 1224 and gates 1226, 1228, 1230, 1232 for applying signals øH1L and øH2 for charge transfer are formed on a gate oxide film formed on the n layer 1212. It is a characteristic that a different signal øH1L is applied to a final stage of øH1. The floating gate 1222 does not overlap with the reset 1220 gate and the output gate 1224. Further, a bias gate 1234 is formed via an insulating film above the floating gate 1222. A source follower amplifier (not shown) of a transistor is connected to the floating gate 1222.

Figure 17B:
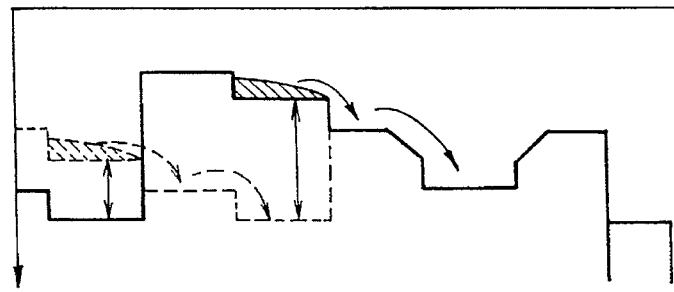
FIG. 17B is a diagram or a potential of the device and FIG. 17C is a timing chart thereof.
Figure 17C:
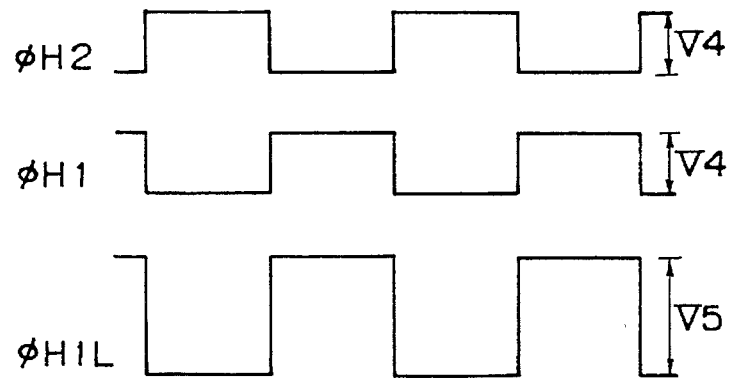

A feature of the thirteenth embodiment is that a signal amplitude of øH1L applied to the gates 1226, 1228 adjacent to the output gate 1224 (or a final gate of the HCCD 92) is larger than that of øH1. FIG. 17B is a diagram of a potential of the device for charge transfer, wherein a solid line and a dashed line represent two timings according to different signals along a path K—K'. FIG. 17C shows a timing chart.

As shown in FIG. 17C, øH1 and øH2 have amplitudes V4, while øH1L has an amplitude V5 larger than V4. Because the signal amplitude V5 of øH1L is larger, the charge coupled device can be operated if a potential of the output gate 1224 is lowered more than prior art. Therefore, the charge coupled device can be operated by lowering the potentials of the bias gate 1234 and the floating gate 1222, so that the generation of leakage current is reduced largely, and the potential of the floating gate hardly fluctuates.

EMBODIMENT 14

Figure 18A:
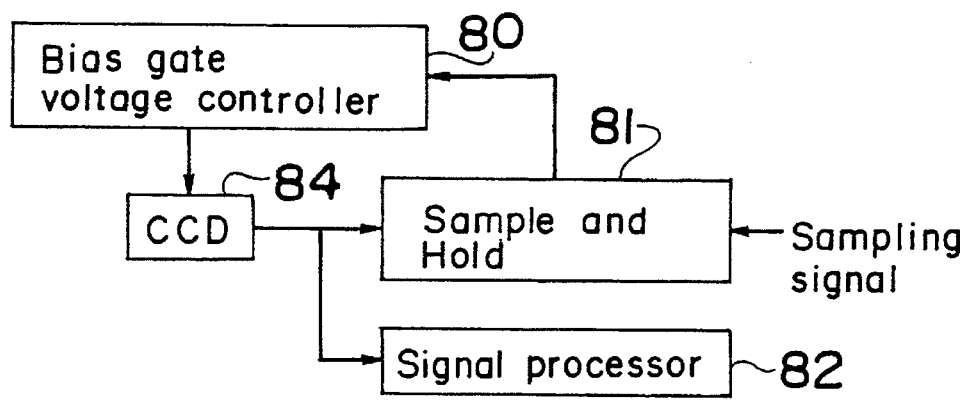
FIG. 18A is a block diagram of a driver for charge coupled device according to a fourteenth embodiment of the invention and FIG. 18B is a circuit diagram of a part of the driver.
Figure 18B:
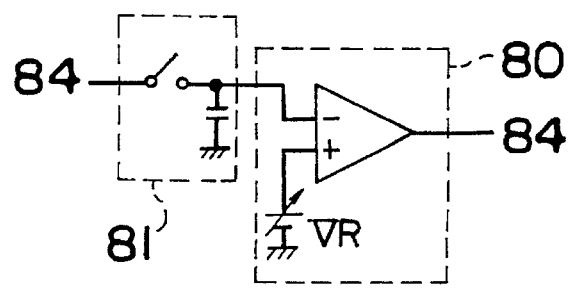

FIG. 18A is a block diagram of a driver for charge coupled device according to a fourteenth embodiment of the invention, wherein a charge coupled device (CCD) 84 has a floating gate amplifier. A sample and hold circuit 81 samples an output signal of the charge coupled device 84 except a signal portion of the output signal according to a sampling signal. The output signal of the charge coupled device 84 is also supplied to a signal processor 82 wherein noise reduction or the like is performed. An output signal of the sample and hold circuit 81 is supplied to a bias gate voltage controller (BGC) 80 which controls a voltage for the bias gate in the charge coupled device 84 according to the input signal. Though not explained here, signals øV1–øV4, øH1, øH2 and øR as shown in FIG. 2 are also supplied to the charge coupled device 84. FIG. 18B shows a circuit diagram of the sample and hold circuit 81 and the bias gate voltage controller 80.

Figure 19A:
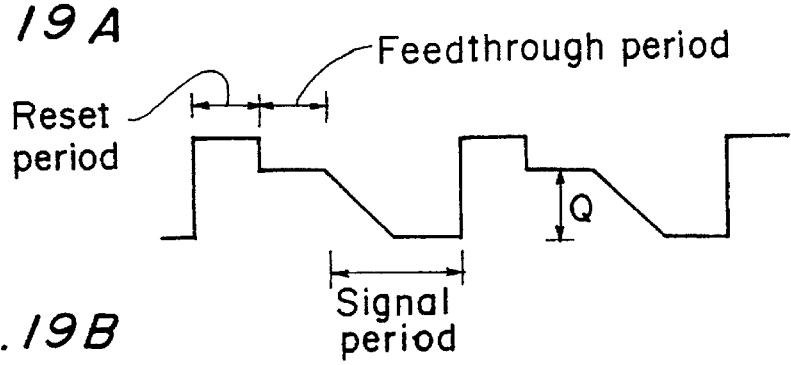
FIGS. 19A, 19B, 19C and 19D are diagrams of waveforms of a charge coupled device.
Figure 19B:
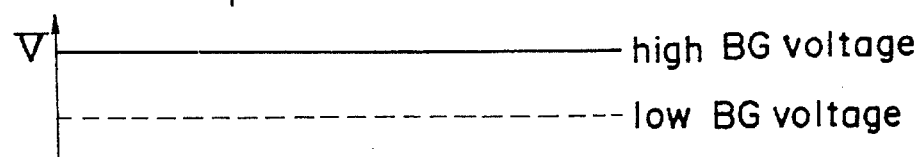
Figure 19C:
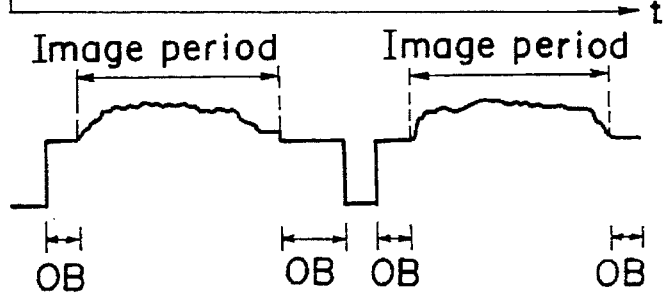

FIGS. 19A, 19B, 19C and 19D are diagrams for illustrating waveforms of the output signal of the charge coupled device 84. As shown in FIG. 19A, the output signal is divided into a reset period, a feedthrough period and a signal period successively. For example, a signal period denotes a period where signal charge Q exists below the floating gate of the floating gate amplifier, and the output signal at the signal period is called as signal voltage. The output signal of the charge coupled device includes not only the signal component shown in FIG. 19A, but also a DC component shown in FIG. 19B. In a case of the floating gate amplifier, the DC component also fluctuates according to a voltage applied to the bias gate. That is, the DC component increases with increasing bias gate voltage.

Figure 19D:
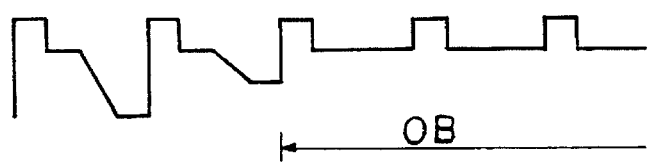

Next, a timing of sampling of the sampling and hold circuit 81 is explained. The charge coupled device 84 generally has a region called as optical black (OB) section wherein no signal charge Q exists. As shown in an example of image signal shown in FIG. 19C, optical black sections exist before and after an image period. As shown in FIG. 19D, an optical black section has reset periods and signals at the feedthrough period and at the signal period become equal to each other. In the present embodiment, the sample and hold circuit 81 samples a signal in the reset and feedthrough periods other than the signal period. In these periods, the signal charge does not exist below the floating gate or is discharged to the reset drain. Further, there is essentially no signal charge in the optical black sections, and a signal can be sampled at any time. A low pass filter may be provided to remove fluctuations due to noises. As explained above, the bias gate voltage is corrected according to the output signal of the charge coupled device even when the floating gate potential fluctuates according to leakage noises or the like.

A signal may be sampled in a period where no signal exists. Therefore, signals of pixels having no photodiode or vertical charge coupled device may be sampled. A signal may also be sampled in a period where no signal exists below the charge detection section by setting the reset gate in an ON state except the normal operation.

EMBODIMENT 15

Figure 20A:
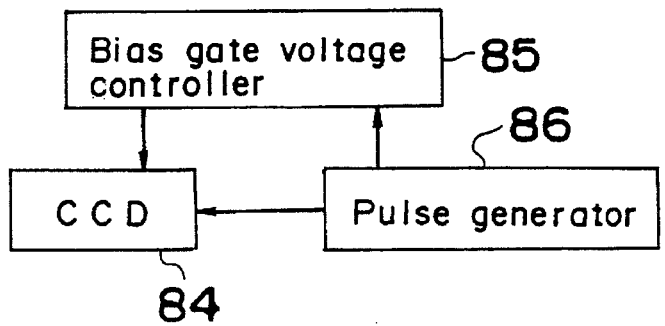
FIG. 20A is a block diagram of a drive device for charge coupled device of a fifteenth embodiment of the invention.

FIG. 20A is a block diagram of a drive device for charge coupled device of a fifteenth embodiment of the invention. A charge coupled device 84 has a floating gate amplifier. A pulse generator 86 supplies a signal to a bias gate voltage controller 85, which in turn changes a voltage for the bias gate of the charge coupled device 84 according to the input signal. On the other hand, the pulse generator 86 supplies signals øV1–øV4, øH1, øH2 and øR to the charge coupled device 84 as shown in FIG. 2.

Figure 20B:
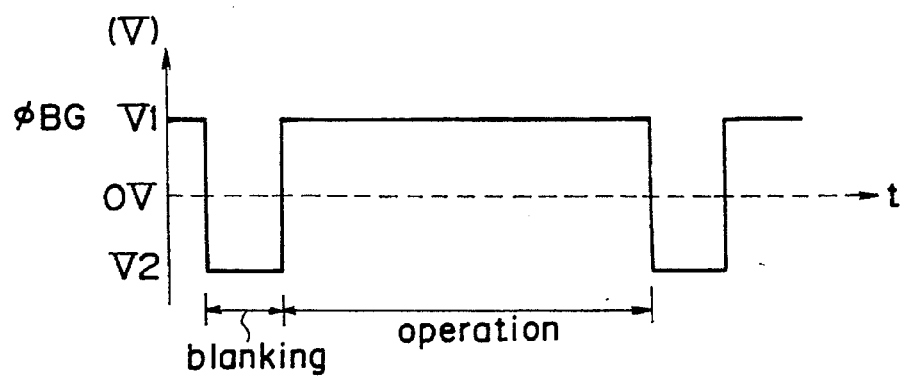
FIGS. 20B and 20C are diagrams of waveforms.

FIG. 20B is a diagram of a waveform of signal øBG where øBG denotes a signal supplied from the bias gate voltage controller 85 to the charge coupled device 84. The fifth embodiment shown in FIGS. 7A and 7B are used as an example. When øBG is applied to the bias gate 430, a potential of the floating gate 422 is set in proportion to øBG. In an operation period, signal charge Q flows in below the floating gate 422, and the bias gate 430 is set at a positive constant potential V1. In a blanking period (including vertical and horizontal periods), signal charge is not transferred to below the floating gate 422. Therefore, the floating gate potential may have any value in a blanking period. In the present embodiment, the bias gate 430 is driven with voltages different between the operation and blanking periods so as to reduce leakage current. In concrete, the bias gate 430 in a blanking period is set at a negative potential V2. Thus, not only the leakage current is reduced, but charge moving due to leakage current in an operation period is almost reset or the floating gate potential does not fluctuate. Then, the output signal of the charge detection device becomes stable.

Figure 20C:
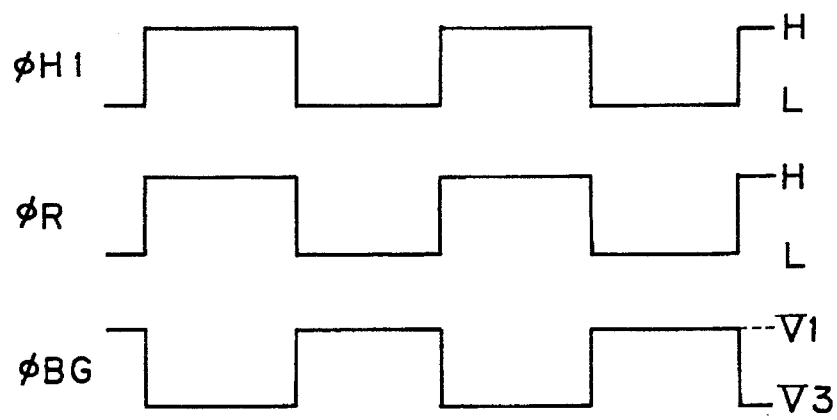

FIG. 20C is a diagram of waveforms of driving signals øBG, øH1 and øR in a scan period, wherein øBG is changed for each signal charge in order to reduce leakage current. When øR is in an ON state, signal charge does not exist below the floating gate 422. Therefore, øBG is not needed to V1 shown in FIG. 20A. Then, the high period of the bias gate 430 is shorten by driving øR and øBG in phases reverse to each other. In this case, øBG is not needed to be applied with a negative voltage, and the applied voltage may be a voltage V3 smaller than V1. Further, if the floating gate potential is larger than the potential of the output gate 424, signal charge can be driven without back flow thereof. Further, there is an advantage that discharge of the signal charge to the reset drain 416 is accelerated by modulating øBG. Thus, leakage current is reduced or an effect of the leakage current can be almost neglected even it exists. Therefore, the charge detection device can provide a stable output signal. It is understood that FIGS. 20B and 20C can be combined for driving.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A driver of a charge detection device comprising:

a floating gate amplifier comprising a bias means;

a charge coupled device which uses said floating gate amplifier for charge detection;

a sample and hold means for sampling a part of an output signal of said charge coupled device; and a controller for controlling a signal applied to said bias means according to an output of said sample and hold means.

2. The driver according to claim 1, wherein said sample and hold means samples an output signal of said charge coupled device when signal charges are discharged from an optival black section or from said floating gate amplifier.

3. A driver of a charge detection device comprising:

a floating gate amplifier comprising a bias means;

a charge coupled device which uses said floating gate amplifier for charge detection;

a pulse generator for generating blanking signals and driving signals for said charge coupled device; and a bias gate voltage controller for controlling signals applied to said bias means according to signals from said pulse generator.

4. The driver according to claim 3, wherein a voltage applied to said bias means is set as V1 in horizontal and vertical blanking periods and as V2 in operating periods and V1>V2.

5. The driver according to claim 3, wherein said charge coupled device comprises a reset means and said bias means and said reset means are driven with phases reverse to each other.

6. A charge detection device comprising:

a semiconductor substrate;

a buried region formed on said semiconductor substrate and to which region a signal charge is transferred;

an insulator film formed on said buried region;

a charge transfer section comprising a plurality of gates, said plurality of gates being formed on said insulator film above said buried region;

an output gate formed at an end of said charge transfer section on said insulator film above said buried region;

a floating gate formed adjacent to said output gate on said insulator film above said buried region, said floating gate being spaced from said output gate with a gap therebetween and without overlapping with said output gate, said floating gate detecting a signal charge accumulated therebelow and transferred through said buried region from said charge transfer section;

a bias gate, provided adjacent to said output gate, for controlling an electric potential of said floating gate;

an amplifier connected to said floating gate; and a reset gate for discharging the signal charge accumulated below said floating gate, said reset gate being formed on the insulator film above said buried region at a side of said floating gate which is opposite to said output gate, said reset gate being spaced from said floating gate with a gap therebetween and without overlapping with said floating gate.

7. A charge detection device comprising:

a semiconductor substrate;

a buried region formed on said semiconductor substrate and to which region a signal charge is transferred;

an insulator film formed on said buried region;

a charge transfer section comprising a plurality of gates, said plurality of gates being formed on said insulator film above said buried region;

an output gate formed at an end of said charge transfer section on said insulator film above said buried region;

a floating gate formed adjacent to said output gate on said insulator film above said buried region, said floating gate detecting a signal charge accumulated therebelow and transferred through said buried region from said charge transfer section;

a bias gate, provided adjacent to said output gate, for controlling an electric potential of said floating gate;

an amplifier connected to said floating gate; and a reset gate for discharging the signal charge accumulated below said floating gate, said reset gate being formed on the insulator film above said buried region at a side of said floating gate which is opposite to said output gate;

wherein a charge storage area of said charge transfer section is defined as an area of said buried region located below one of said gates of said charge transfer section and is larger than a charge storage area of said floating gate which is defined as an area of said buried region located below said floating gate.

8. A charge detection device comprising:

a semiconductor substrate;

a buried region formed on said semiconductor substrate and to which region a signal charge is transferred;

an insulator film formed on said buried region;

a charge transfer section comprising a plurality of gates, said plurality of gates being formed on said insulator film above said buried region;

an output gate formed at an end of said charge transfer section on said insulator film above said buried region;

a bias gate formed adjacent to said output gate on said insulator film above said buried region;

a floating gate formed below said bias gate under said buried region, said floating gate detecting a signal charge accumulated thereabove and transferred through said buried region from said charge transfer section;

an amplifier connected to said floating gate; and a reset gate for discharging the signal charge accumulated below said floating gate, said reset gate being formed on the insulator film above said buried region at a side of said bias gate which is opposite to said output gate.

9. A charge detection device comprising:

a semiconductor substrate;

a buried region formed on said semiconductor substrate and to which region a signal charge is transferred;

an insulator film formed on said buried region;

a charge transfer section comprising a plurality of gates, said plurality of gates being formed on said insulator film above said buried region;

an output gate formed at an end of said charge transfer section on said insulator film above said buried region;

a floating gate formed adjacent to said output gate on said insulator film above said buried region, said floating gate detecting a signal charge accumulated therebelow and transferred through said buried region from said charge transfer section, a width of said floating gate being larger at a central portion of said floating gate than at opposite peripheral portions relative to a lengthwise direction of a flow of the signal charge;

a bias gate, provided adjacent to said output gate, for controlling an electric potential of said floating gate;

an amplifier connected to said floating gate; and a reset gate for discharging the signal charge accumulated below said floating gate, said reset gate being formed on the insulator film above said buried region at a side of said floating gate which is opposite to said output gate.

10. A charge detection device comprising:

a semiconductor substrate;

a buried region formed on said semiconductor substrate and to which region a signal charge is transferred;

an insulator film formed on said buried region;

a charge transfer section comprising a plurality of gates, said plurality of gates being formed on said insulator film above said buried region;

an output gate formed at an end of said charge transfer section on said insulator film above said buried region;

a floating gate formed adjacent to said output gate on said insulator film above said buried region, said floating gate detecting a signal charge accumulated therebelow and transferred through said buried region from said charge transfer section;

a high concentration region formed in said buried region below a central portion of said floating gate, said high concentration region having a dopant concentration larger than that of said buried region;

a bias gate, provided adjacent to said output gate, for controlling an electric potential of said floating gate;

an amplifier connected to said floating gate; and a reset gate for discharging the signal charge accumulated below said floating gate, said reset gate being formed above said buried region on said insulator film at a side of said floating gate which is opposite to said output gate.

11. A charge detection device comprising:

a semiconductor substrate having a first well of a conduction type and a second well of a same conduction type, said second well having a dopant concentration which is smaller than that of said first well;

a buried region formed on said first and second wells of said semiconductor substrate and to which region a signal charge is transferred, said buried region having an opposite conduction type than that of said first and second wells;

an insulator film formed on said buried region;

a charge transfer section comprising a plurality of gates, said plurality of gates being formed on said insulator film above said buried region;

an output gate formed at an end of said charge transfer section on said insulator film above said buried region;

a floating gate formed adjacent to said output gate on said insulator film above said buried region, said floating gate detecting a signal charge accumulated therebelow and transferred through said buried region from said charge transfer section;

a bias gate, provided adjacent to said output gate, for controlling an electric potential of said floating gate;

an amplifier connected to said floating gate; and a reset gate for discharging the signal charge accumulated below said floating gate, said reset gate being formed on said insulator film above said buried region at a side of said floating gate which is opposite to said output gate, wherein said buried region is formed on said second well of said semiconductor substrate below said floating gate and said reset gate.

12. A charge detection device comprising:

a semiconductor substrate;

a buried region formed on said semiconductor substrate and to which region a signal charge is transferred;

a first insulating film formed on a first portion of said semiconductor substrate above said buried region;

a second insulating film formed on a second portion of said semiconductor substrate above said buried region adjacent to said first insulating film, said second insulating film having a thickness which is smaller than said first insulating film;

a charge transfer section comprising a plurality of gates, said plurality of gates being formed on said first insulator film above said buried region;

an output gate formed at an end of said charge transfer section on said first insulator film above said buried region;

a floating gate formed adjacent to said output gate on said second insulator film above said buried region, said floating gate detecting a signal charge accumulated therebelow and transferred through said buried region from said charge transfer section;

a bias gate, provided adjacent to said output gate, for controlling an electric potential of said floating gate;

an amplifier formed above said buried region on said second insulator film, the amplifier being electrically connected to said floating gate; and a reset gate for discharging the signal charge accumulated below said floating gate, said reset gate being formed on said second insulator film above said buried region at a side of said floating gate which is opposite to said output gate.

13. A charge detection device comprising:

a semiconductor substrate;

a buried region formed on said semiconductor substrate and to which region a signal charge is transferred;

an insulator film formed on said buried region;

a charge transfer section comprising a plurality of gates, said plurality of gates being formed on said insulator film above said buried region;

an output gate formed at an end of said charge transfer section on said insulator film above said buried region;

a floating gate formed adjacent to said output gate on said insulator film above said buried region, said floating gate detecting a signal charge accumulated therebelow and transferred through said buried region from said charge transfer section;

a bias gate provided above said floating gate for controlling an electric potential of said floating gate;

an amplifier connected to said floating gate; and a reset drain for discharging the signal charge accumulated below said floating gate and formed adjacent to said buried region at a side of said floating gate which is opposite to said output gate, said reset drain being spaced from said floating gate by a predetermined gap and said bias gate extending above a part of said gap.

14. A charge detection device comprising:

a semiconductor substrate;

a buried region formed on said semiconductor substrate and to which region a signal charge is transferred;

an insulator film formed on said buried region;

a charge transfer section comprising a plurality of gates, said plurality of gates being formed on said insulator film above said buried region;

an output gate formed at an end of said charge transfer section on said insulator film above said buried region;

a floating gate formed adjacent to said output gate on said insulator film above said buried region, said floating gate detecting a signal charge accumulated therebelow and transferred through said buried region from said charge transfer section;

a reset gate for discharging the signal charge accumulated below said floating gate, said reset gate being formed above said buried region on said insulator film at a side of said floating gate which is opposite to said output gate;

an amplifier formed on said substrate, said floating gate extending above said amplifier;

a field oxide film formed between and separating said amplifier and said charge transfer section on said substrate, said floating gate extending above said field oxide film from said charge transfer section to said amplifier; and a bias gate provided above said field oxide film for controlling an electric potential of said floating gate, wherein said bias gate and a part of said floating gate overlap each other above said field oxide film.

15. The device according to claim 14, wherein said floating gate comprises an electrically conducting plate formed only above said buried region and a contact extending to said field oxide film.

16. The device according to claim 14, wherein said bias gate is located between said floating gate and said field oxide film.

17. The device according to claim 14, further comprising a metallic line which forms a portion of said floating gate extending over said field oxide film, and another gate electrically connected to said bias gate, said another gate located between said field oxide film and said metallic line.

18. The device according to claim 14, further comprising a metallic line which forms a portion of said floating gate extending over said field oxide film, and another gate electrically connected to said bias gate, said another gate and said bias gate being located between said field oxide film and said metallic line.

19. A charge detection device comprising:

a semiconductor substrate;

a buried region formed on said semiconductor substrate and to which region a signal charge is transferred;

an insulator film formed on said buried region;

a charge transfer section comprising a plurality of gates, said plurality of gates being formed on said insulator film above said buried region;

an output gate formed at an end of said charge transfer section on said insulator film above said buried region;

a floating gate formed adjacent to said output gate on said insulator film above said buried region, said floating gate detecting a signal charge accumulated therebelow and transferred through said buried region from said charge transfer section;

a reset gate for discharging the signal charge accumulated below said floating gate, said reset gate being formed on said insulator film above said buried region at a side of said floating gate which is opposite to said output gate;

a bias gate, provided adjacent to said floating gate and not above said buried region, for controlling an electric potential of said floating gate; and an amplifier formed on said substrate and connected to said floating gate through an electrically conducting line, a gate of said amplifier being formed in an active region of a first stage transistor of said amplifier in said substrate.

20. A charge detection device comprising:

a semiconductor substrate;

a buried region formed on said semiconductor substrate and to which region a signal charge is transferred;

an insulator film formed on said buried region;

a charge transfer section comprising a plurality of gates, said plurality of gates being formed on said insulator film above said buried region;

an output gate formed at an end of said charge transfer section on said insulator film above said buried region;

a floating gate formed adjacent to said output gate on the insulator film above said buried region, said floating gate comprising an electrically conducting layer which is arranged opposite to said buried layer, said floating gate detecting signal charges transfer through said buried region from said charge transfer section;

a bias gate, provided adjacent to said output gate, for controlling an electric potential of said floating gate;

an amplifier connected to said floating gate; and a reset means for discharging the signal charge accumulated below said floating gate, said reset gate being formed on the insulator film above said buried region at a side opposite to said output gate with respect to said floating gate.

21. A driving method for a charge detection device, the charge detection device including a semiconductor substrate, a buried region formed on the semiconductor substrate and to which region a signal charge is transferred, an insulator film formed on the buried region, a charge transfer section including a plurality of gates formed on the insulator film above the buried region, an output gate formed at an end of the charge transfer section on the insulator film above the buried region, a floating gate formed adjacent to the output gate on the insulator film above the buried region, the floating gate detecting a signal charge transferred through the buried region from the charge transfer section, a bias gate provided above the floating gate for controlling an electric potential of the floating gate, an amplifier connected to the floating gate, and a reset gate for discharging the signal charge, said method comprising the steps of:

supplying first driving signals to a last gate of the charge transfer section; and supplying second driving signals to the other gates of said charger transfer section, the first driving signals having a signal amplitude which is smaller than that of the second driving signals.

* * * * *